(12) United States Patent
Blumenthal et al.

(10) Patent No.: US 9,543,737 B2
(45) Date of Patent: Jan. 10, 2017

(54) FAST CALIBRATION AND PROGRAMMING OPTICAL COMPONENTS

(71) Applicant: OE SOLUTIONS AMERICA, INC., Englewood Cliffs, NJ (US)

(72) Inventors: Daniel Blumenthal, Englewood Cliffs, NJ (US); Holger Klein, Englewood Cliffs, NJ (US); Chad Althouse, Englewood Cliffs, NJ (US); Todd Chicci, Englewood Cliffs, NJ (US); Patrick Bybee, Englewood Cliffs, NJ (US); Henrik Poulsen, Englewood Cliffs, NJ (US); Sarat Chandra Gundavarapu, Englewood Cliffs, NJ (US)

(73) Assignee: OE SOLUTIONS AMERICA, INC., Englewood Cliffs, NJ (US)

( * ) Notice: Subject to any disclaimer, the term of this patent is extended or adjusted under 35 U.S.C. 154(b) by 0 days.

(21) Appl. No.: 14/928,998

(22) Filed: Oct. 30, 2015

(65) Prior Publication Data

US 2016/0254644 A1    Sep. 1, 2016

Related U.S. Application Data

(60) Provisional application No. 62/073,713, filed on Oct. 31, 2014.

(51) Int. Cl.
*H01S 5/00*    (2006.01)
*H01S 5/12*    (2006.01)
(Continued)

(52) U.S. Cl.
CPC ........... *H01S 5/1209* (2013.01); *H01S 5/0014* (2013.01); *H01S 5/0268* (2013.01); *H01S 5/0617* (2013.01);
(Continued)

(58) Field of Classification Search
CPC .. H01S 5/06256; H01S 5/0625; H01S 5/0617; H01S 5/1209; H01S 5/12; H01S 5/0687; H01S 5/0683; H01S 5/0268
(Continued)

(56) References Cited

U.S. PATENT DOCUMENTS 6,160,825 A    12/2000  Konig
6,191,878 B1    2/2001  Spivey et al.
(Continued)

FOREIGN PATENT DOCUMENTS

WO    2014107537    7/2014

OTHER PUBLICATIONS

International Search Report, dated Feb. 2, 2016.

*Primary Examiner* — Kinam Park
(74) *Attorney, Agent, or Firm* — Karish & Bjorgum, PC

(57) ABSTRACT

A method and apparatus for calibrating and controlling tunable lasers are disclosed. Multiple methodologies disclosed herein may be used, alone or in combination, which significantly speed up a calibration time and thus provide a significant advantage over existing technology in calibrating the tunable lasers. Certain methodologies benefit from a unique design of the tunable lasers that couple two or more optical facets to an output. The tunable lasers may be equipped with two or more sampled grating distributed Bragg reflector (SGDBR) mirrors and may include Semiconductor Optical Amplifiers (SOAs) after the SGDBR mirrors.

26 Claims, 24 Drawing Sheets

(51) Int. Cl.
  *H01S 5/125*   (2006.01)
  *H01S 5/0625*  (2006.01)
  *H01S 5/0687*  (2006.01)
  *H01S 5/026*   (2006.01)
  *H01S 5/0683*  (2006.01)
  *H01S 5/06*    (2006.01)

(52) U.S. Cl.
  CPC ........... *H01S 5/0683* (2013.01); *H01S 5/0687* (2013.01); *H01S 5/06256* (2013.01); *H01S 5/12* (2013.01); *H01S 5/125* (2013.01)

(58) Field of Classification Search
  USPC .......................................... 372/50.11, 50.1, 32
  See application file for complete search history.

(56)         References Cited

U.S. PATENT DOCUMENTS

|              |       |         |                           |
|--------------|-------|---------|---------------------------|
| 6,904,070    | B2    | 6/2005  | Pontis et al.             |
| 6,954,476    | B2    | 10/2005 | Coldren et al.            |
| 8,644,713    | B2    | 2/2014  | Poulsen et al.            |
| 2003/0147442 | A1*   | 8/2003  | Larson ............... H01S 5/06256 |
|              |       |         | 372/50.11                 |
| 2005/0100065 | A1    | 5/2005  | Coldren et al.            |
| 2006/0072634 | A1    | 4/2006  | Daiber                    |
| 2011/0116792 | A1    | 5/2011  | Blumenthal et al.         |
| 2013/0243015 | A1    | 9/2013  | Eriksson et al.           |
| 2014/0022628 | A1    | 1/2014  | Meyer                     |
| 2014/0028997 | A1    | 1/2014  | Cable et al.              |
| 2014/0147130 | A1    | 5/2014  | Poulsen et al.            |
| 2015/0333475 | A1*   | 11/2015 | Blumenthal ......... H01S 5/0206 |
|              |       |         | 372/20                    |
| 2015/0365177 | A1    | 12/2015 | Blumenthal et al.         |

\* cited by examiner

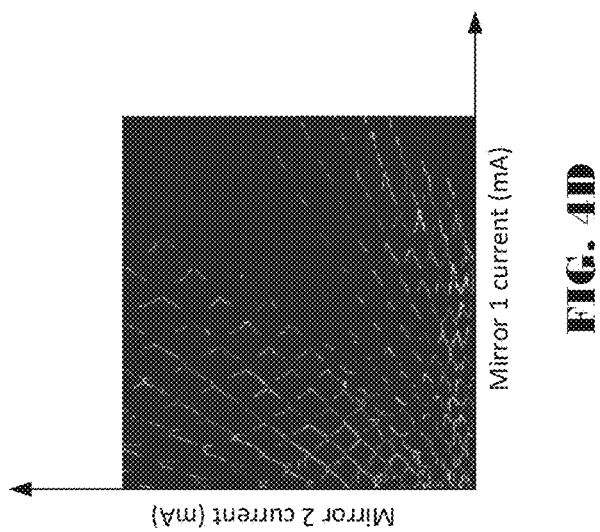
FIG. 4D
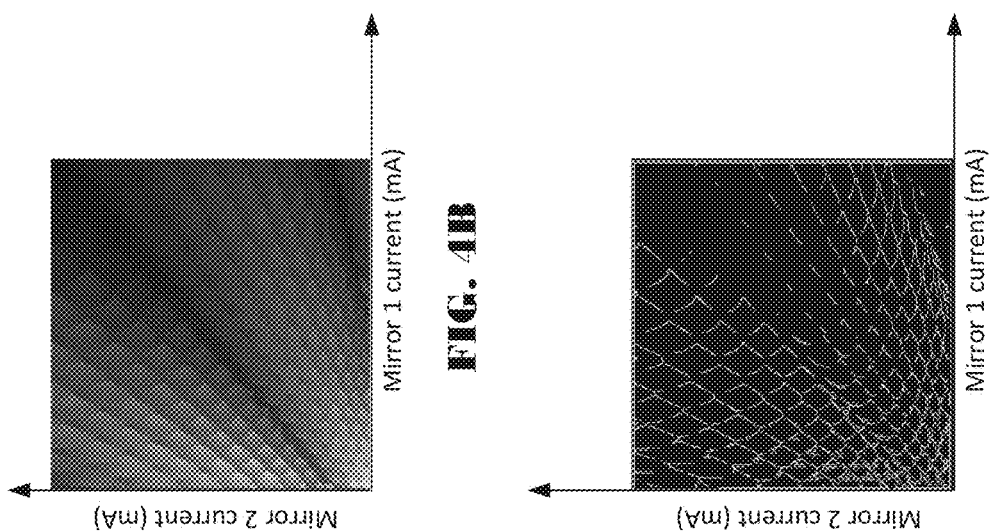
FIG. 4B
FIG. 4C

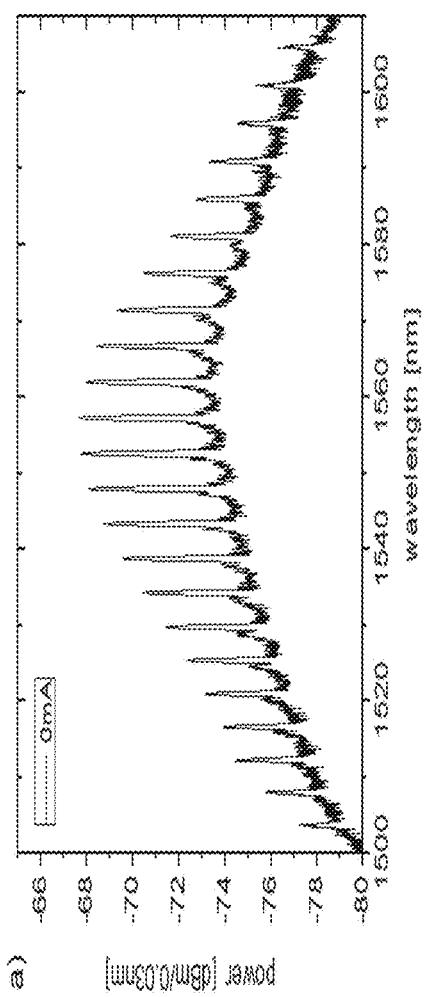
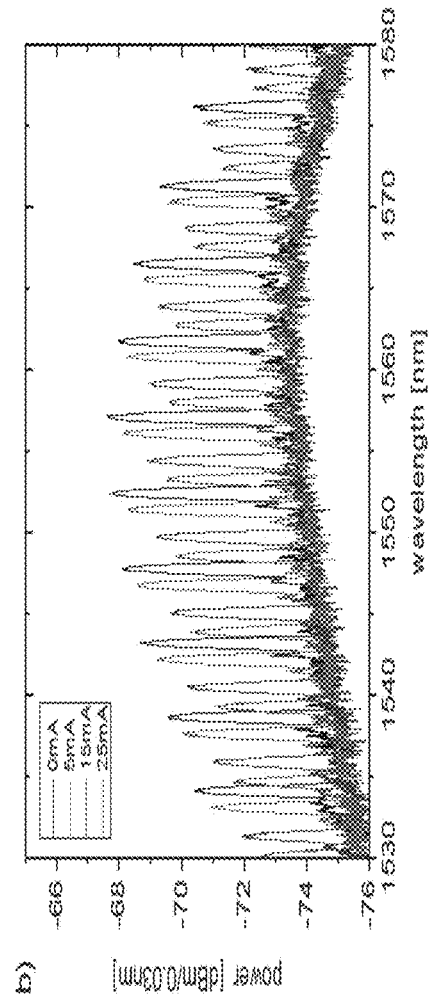
FIG. 6A
FIG. 6B

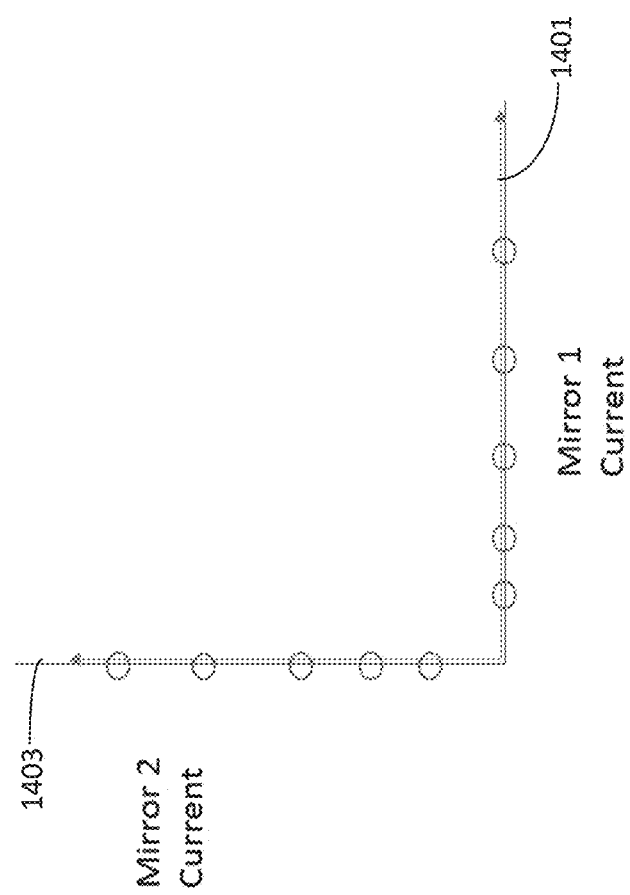

FAST CALIBRATION AND PROGRAMMING OPTICAL COMPONENTS

CLAIM OF PRIORITY UNDER 35 U.S.C. §119

This patent application claims benefit of U.S. Provisional Patent Application Ser. No. 62/073,713, filed on Oct. 31, 2014, titled "Method and apparatus for fast calibration and programming tunable lasers and associated transmitters and optical subassemblies," the entire disclosure of which is incorporated by reference herein in its entirety.

BACKGROUND

Today's fiber optic based networks use transceivers as the interface between electronics and optical signals that propagate on the optical fiber and at other points in a network in which information is converted between electronic form and optical form.

The optical communication device including photonic and/or optoelectronic devices and components used to transmit, code, receive, decode optical data for transmission on an optical fiber, are interfaced to a variety of electronic circuits used to control these elements as well as to interface data in electronic form on the transmit and receive side, code and decode electronic data, perform other functions like clock recovery and error correction and realize functions required to control the environment of these circuits including temperature.

The challenges that exist today for tunable lasers, modules, and/or subassemblies, based on tunable lasers, are in part in the complexity and time involved in calibrating output characteristics of an output, in particular, optical frequency (or wavelength) in response to an applied control signal (for example voltage, current, temperature or any combination thereof). Depending on a laser design and tuning physics, a control method and control signals can vary widely. There are several classes of tunable lasers, including those designs that can tune to any desired wavelength (within some specified accuracy) over a wide range of tuning, for example, a C-band or O-band for communications systems.

The cost of manufacturing tunable lasers and making their wavelength calibration fast and robust is critical in replacing fixed wavelength lasers with tunable lasers as well as opening new applications and markets. A need to move to tunable lasers in systems where many wavelengths or channels are transmitted on a single fiber has become an economical and practical necessity because carrying an inventory of all fixed wavelength lasers, the infrastructure needed to support specifying and carrying this inventory as well as the cost of having a downtime for a channel due to non-availability and mistake made in shipping the wrong wavelength lasers to the field become significant factors for today's high capacity networks where each fiber can carry, 40, 80, 96, 128 or more wavelengths.

Additionally, the cost of new modules that are configured to transmit data at 100 Giga bits per second (Gbps), 200 Gbps, 400 Gbs and faster, makes it necessary to use a tunable laser such that one module type can be used to access any channel on the fiber channel. For these new high capacity systems it has become prohibitively expensive to deploy these interfaces with fixed wavelength lasers and the industry is moving in a direction of tunable lasers for single wavelength high bit rate modules and interfaces.

One widely used class of tunable laser that can be monolithically integrated onto a photonic integrated circuit (PIC), such as that described in U.S. Patent Provisional Application Ser. No. 61/748,415, which is incorporated herein by reference in its entirety, belongs to the quasi-continuous tuning class of laser, which is defined as a laser capable of reaching any desired wavelength with a control system that needs to control multiple sections of the laser with set of control signals that are mapped between control signals and wavelengths. Often, the control methods used to tune quasi-continuous lasers can be complex, with complex relationships between control signals and output wavelength, and thus techniques like lookup tables are utilized where the full tuning maps for all control signals and desired wavelengths are stored during a calibration time. The quasi-continuous laser type is differentiated from the contiguous laser type in that the later can be tuned continuously with an adjustment of a single knob or single control signal that can sweep through all output frequencies or wavelengths, and the control and often time calibration are simplified over the quasi-contiguous laser.

A primary issue with tunable lasers, and in particular quasi-continuous lasers like that described in U.S. Patent Provisional Application Ser. No. 61/748,415, however, is the time it takes to fully calibrate the tunable laser in terms of control signals and output wavelengths. This calibration must be fast, must not become a bottleneck in the manufacturing process or will significantly drive up the laser cost and manufacturing throughput, but will also affect the robustness of the calibration, a degree of process automation and robustness to design tolerances, surrounding control circuits and optics, process variations and laser operating and aging variations.

As tunable lasers and other components are more tightly integrated (like optical data modulators and wavelength lockers for example), fast calibration times and associated methods and apparatus will become critical to wide-scale deployment of tunable laser in terms of cost, integration of the laser into other subassemblies and systems. Additionally, the speed of laser wavelength calibration can affect where the calibration can occur, and fast techniques leave open the possibility to calibrate not only at the manufacturer of the laser, but at equipment manufacturers that build the laser based component into a system, and even recalibration of the laser in the system out in the field.

An aspect of today's technology is that for calibration of a tunable laser, linear monolithic code running on microprocessors and/or state machines is used for a calibration routine, and the results of the calibration may then be stored in a lookup table used to map control signals to a desired output wavelength. However, there are several drawbacks with this approach, one is the efficiency (lack of speed) in using a personal computer (PC) or microprocessor approach to execute the calibration routine and control and interface to all of the tooling and equipment as well as the tunable laser or the device to be calibrated. Another drawback is the uniformity of manufacturing, where in the end the calibration data may be stored in an FPGA, and the ability to run calibration routines during manufacturing and once the tunable laser based product is utilized in a communications systems requires a separate microprocessor for wavelength calibration. Uniformity of code, modulatory of code, uniformity of hardware in the manufacturing and calibration line as well as in the deployment line, leads to economic and other efficiencies over existing technologies.

The primary drawbacks to existing wavelength calibration methods and apparatus are related in part to a laser design and techniques enabling the calibration process as well as automation and software control of the calibration.

These calibration drawbacks limit the market for tunable laser and optical subassemblies and communications modules employing such lasers, by increasing the cost, time and complexity to manufacture as well as limitations to re-calibration while being installed in a product or deployed in the field.

Therefore there is a need for new high speed tunable laser calibration techniques, algorithms and implementations to lower the cost and time of manufacturing and providing increased automation of integrating such tunable lasers into systems, communications systems and networks.

SUMMARY

In accordance with the present disclosure, disclosed herein are apparatuses and methods for wavelength calibration of a tunable laser for optical communications. The tunable laser is configured to provide access to multiple facets of a plurality of mirrors at an optical output, and each mirror has a different sampled grating period. Mirror currents that are needed to tune the plurality of mirrors to a desired wavelength for the tunable laser may be determined, via electronic circuit, based on at least one of: a gain-voltage map of a gain section of the tunable laser, a semiconductor optical amplifier (SOA) photocurrent map, mirror reflection spectra of the plurality of mirrors, and mode-hopping of the tunable laser.

In an aspect of the present disclosure, voltage values of the gain section of the tunable laser may be monitored, via the electronic circuit, over a span of mirror currents; and, via the electronic circuit, points of voltage drops or minima may be determined. The points of voltage drops or minima being represent that the tunable laser is outputting maximum power at a set of mirror currents.

In another aspect of the present disclosure, via the electronic circuit, output power from each facet of the plurality of mirrors is determined using a plurality of SOAs operating as photodetectors. Further, the SOA photocurrent map of a SOA is determined based on varying mirror currents and optical output from the tunable laser, and the SOA is one of a plurality of SOAs associated with the tunable laser. Also, center locations of contours on the determined SOA photocurrent map are determined via image processing by the electronic circuit.

In an aspect of the present disclosure, one of the plurality of SOAs may be forward biased via the electronic circuit, and the remaining other SOAs of the plurality of SOAs are reverse biased.

In an aspect of the present disclosure, reflection spectra of the plurality of mirrors are obtained over a span of mirror currents. Also, based on an analysis of the reflection spectra of the plurality of mirrors, mirror currents are determined that are needed to tune the plurality of mirrors to a particular wavelength for the tunable laser.

In another aspect of the present disclosure, a graph of mirror peaks at mirror currents for the plurality of mirrors may be created, and the mirror currents for all wavelengths in a maximum range may be obtained.

In an aspect of the present disclosure, values of the mirror currents for the particular wavelength may be stored in memory as a look-up table.

In another aspect of the present disclosure, a gain voltage tuning map of a gain section (e.g., a laser diode (LD) section) may be generated, and, via image processing, minima in the gain voltage tuning map may be determined.

Further, via the image processing, wavelength outputs associated with control points corresponding to the minima may be determined.

In an aspect of the present disclosure, one of a plurality of semiconductor optical amplifiers (SOAs) may be forward biased and the remaining other SOAs of the plurality of SOAs may be reverse biased.

In another aspect of the present disclosure, data on optical outputs of the plurality of SOAs may be collected and an optical spectrum over a span of mirror current limits may be determined, based on the collected data.

In another aspect of the present disclosure, a SOA photocurrent map of an optical amplifier (e.g., a SOA) may be obtained, and via the image processing, edges may be detected on the obtained SOA photocurrent map.

Further, via the image processing, contours may be determined on the SOA photocurrent map and locations of centers of the detected contours may be determined on the SOA photocurrent map. The determined locations of centers of the detected contours may be mapped to mirror currents for points of operation for tuning a wavelength of the tunable laser.

In an aspect of the present disclosure, mirror reflection spectra from the plurality of mirrors may be measured and peak wavelengths may be determined based on the measured mirror reflection spectra.

In an aspect of the present disclosure, an underlying amplified spontaneous emission (ASE) may be determined, an averaging operation may be applied to the measured mirror reflection spectra, and the underlying amplified spontaneous emission may be subtracted from the averaged mirror reflection spectra.

In an aspect of the present disclosure a polynomial fit may be applied to data including a plurality of traces of the determined peak wavelengths over the plurality of mirror currents; and the polynomial fitted data may be stored in memory as a look-up table.

In an aspect of the present disclosure, one or more starting points of wavelength hops may be found, the wavelength hops may be traced along a one-dimensional line of mirror currents on the plurality of mirrors, and operating settings of mirror currents for a desired wavelength may be determined. Further, a cavity mode position of the tunable laser which acts as a fine tuning of the desired wavelength may be optimized.

In another aspect of the present disclosure, an apparatus is provided for wavelength calibration for an optical communication device. The apparatus includes a tunable laser configured to provide access to multiple facets of a plurality of mirrors at an optical output, each mirror having a different sampled grating period, and electronic circuit coupled to the tunable laser and a host controller. Further, the electronic circuit is configured to: determine mirror currents that are needed to tune the plurality of mirrors to a desired wavelength for the tunable laser, based on at least one of: a gain-voltage map of a gain section of the tunable laser, a semiconductor optical amplifier (SOA) photocurrent map, reflection spectra of the plurality of mirrors, and mode-hopping of the tunable laser.

In an aspect of the present disclosure, the electronic circuit of the apparatus is further configured to: monitor voltage values of the gain section of the tunable laser over a span of mirror currents; and determine points of voltage drops or minima, the points of voltage drops or minima being representing that the tunable laser is outputting maximum power at a set of mirror currents.

In another aspect of the present disclosure, the electronic circuit of the apparatus is further configured to: monitor output power from each facet of the plurality of mirrors, via a plurality of SOAs configured to operate as photodetectors; determine the SOA photocurrent map, based on varying mirror currents and optical output from the tunable laser, the SOA photocurrent map being associated with one of the plurality of SOAs; and determine, via image processing on the SOA photocurrent map, center locations of contours on the determined SOA photocurrent map.

In an aspect of the present disclosure, the electronic circuit of the apparatus is further configured to: forward bias one of the plurality of SOAs; and reverse bias the remaining other SOAs of the plurality of SOAs.

In an aspect of the present disclosure, the electronic circuit of the apparatus is further configured to: obtain reflection spectra of the plurality of mirrors over a span of mirror currents; and determine mirror currents that are needed to tune the plurality of mirrors to the desired wavelength for the tunable laser, based on an analysis of the reflection spectra of the plurality of mirrors.

In an aspect of the present disclosure, the electronic circuit of the apparatus is further configured to: find one or more starting points of wavelength hops; trace the wavelength hops along a one-dimensional line of mirror currents on the plurality of mirrors; determine operating settings of mirror currents for the desired wavelength; and optimize a cavity mode position of the tunable laser, which acts as a fine tuning of the tunable laser.

In an aspect of the present disclosure, the plurality of mirrors may each include a sampled grating distributed Bragg reflector mirror.

In an aspect of the present disclosure, the electronic circuit may include at least one of: a processor, a microcontroller, a field programmable gate array (FPGA), and an application specific integrated circuit (ASIC).

In an aspect of the present disclosure, the apparatus may include a plurality of semiconductor optical amplifiers (SOAs) corresponding to the plurality of mirrors.

In an aspect of the present disclosure, the electronic circuit is further configured to: obtain a SOA photocurrent map; detect edges, via the image processing, on the obtained SOA photocurrent map; detect, via the image processing, contours on the SOA photocurrent map; determine, via the image processing, locations of centers of the detected contours on the SOA photocurrent map; and map the determined locations of centers of the detected contours to mirror currents for points of operation for tuning a wavelength of the tunable laser to the desired wavelength.

In an aspect of the present disclosure, the apparatus may include a memory coupled to the electronic circuit and configured to store the mirror currents for the desired wavelength of the tunable laser.

These and other aspects of the present disclosure will become more fully understood upon a review of the detailed description, which follows.

BRIEF DESCRIPTION OF THE DRAWINGS

A more detailed understanding may be obtained from the following description in conjunction with the accompanying drawings.

FIGS. 4B-4D are diagrams illustrating examples of SOA maps in accordance with an aspect of the present disclosure.

FIGS. 6A and 6B are graphs illustrating examples of mirror reflection spectra in accordance with an aspect of the present disclosure.

FIG. 14 is a graph illustrating an example of wavelength calibration in accordance with an aspect of the present disclosure.

FIG. 14 is a graph illustrating part of a wavelength calibration process in accordance with an aspect of the present disclosure.

DETAILED DESCRIPTION

The detailed description of illustrative examples will now be set forth below in connection with the various drawings. The description below is intended to be exemplary and in no way limit the scope of the claimed invention. It provides a detailed example of possible implementation, and is not intended to represent the only configuration in which the concepts described herein may be practiced. As such, the detailed description includes specific details for the purpose of providing a thorough understanding of various concepts, and it is noted that these concepts may be practiced without these specific details. In some instances, well known structures and components are shown in block diagram form in order to avoid obscuring such concepts.

According to the present invention, methods and apparatus for fast calibration and programming of optical components is provided, including methods and apparatus for fast calibration and programming of tunable lasers and associated transmitters and optical subassemblies, is provided. In one embodiment, optical devices, including optical transceivers, modules and subassemblies, and laser transmitters and receivers are provided. The optical devices employ combinations of integrated electronics and photonic integrated circuits that contain multiple elements like widely tunable semiconductor lasers, integrated on the same substrate, with optical modulators and semiconductor optical amplifiers and non-integrated optical and optoelectronic elements, and other measurement and control devices and elements. The methods and apparatus according to the present invention increase the speed of the overall calibration process of the optical components through a multi-stage process, thereby significantly decreasing calibration time.

Existing technology in calibration of tunable lasers involves straightforward searches in which the laser or laser sections are incrementally adjusted to all possible values and the laser outputs are recorded along with adjustment values. The optical outputs of the tunable laser are monitored for parameters such as wavelength, optical power, and optical side-mode-suppression-ratio (SMSR). One of the problems with this brute force approach is that a value of each control parameter has to be provided with a high enough resolution so as not to miss a tuning channel output, and in today's monolithically integrated semiconductor lasers, there are multiple sections that must be controlled and tuned. As such, the number of data points for tuning the tunable lasers can be extremely large, in the order of tens of thousands. The test equipment needed to record the laser outputs in response to the applied control signals, can have response times from milliseconds to seconds, making a calibration process historically to increase to tens of hours.

Figure 1:
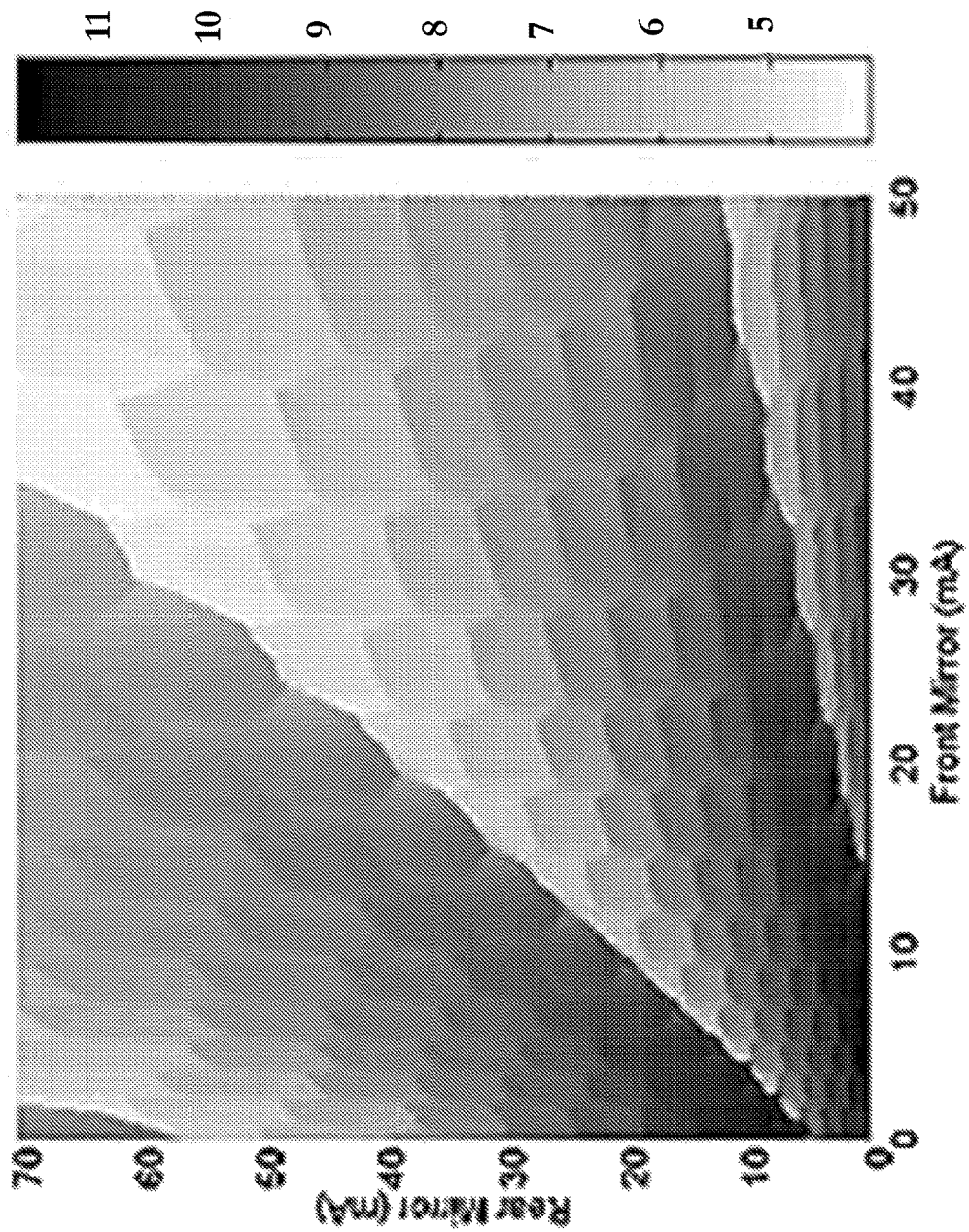
FIG. 1 is a diagram illustrating an example of a wavelength tuning map with varying currents in front and rear mirrors of a tunable laser in accordance with an aspect of the present disclosure.

For a tunable laser that utilizes two controllable mirrors, a standard calibration may be used and referred to as a wavelength tuning map, where the laser output power is recorded as the mirrors are tuned incrementally. In one implementation, a 2-dimensional contour map similar to that shown in FIG. 1 may be generated as a wavelength tuning map. FIG. 1 illustrates a typical wavelength tuning map with varying currents in front and rear mirrors of a tunable laser.

Figure 2:
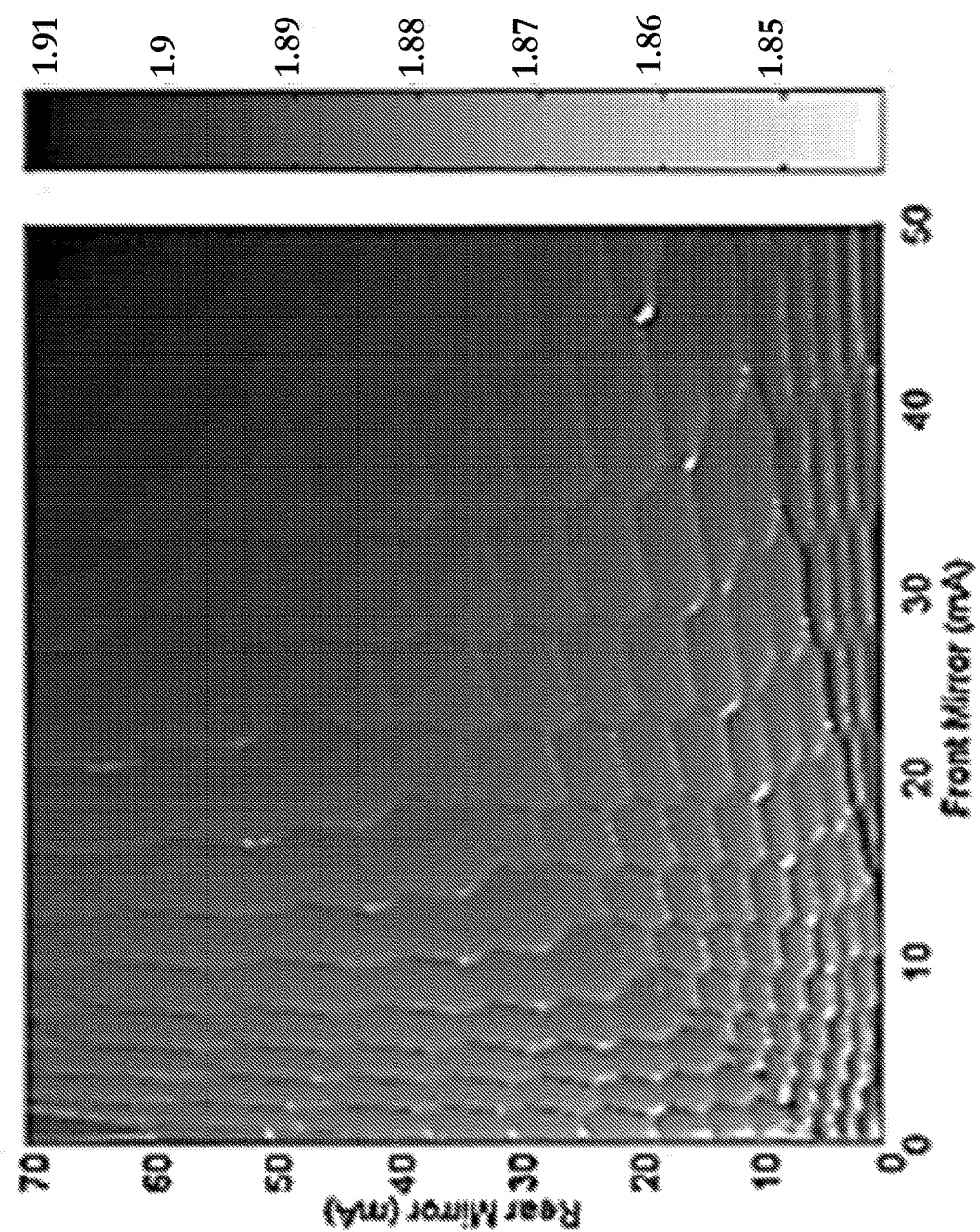
FIG. 2 is a diagram illustrating an example of a gain voltage tuning map in accordance with an aspect of the present disclosure.

Issues that arise in wavelength and parameter calibration of the tunable laser include an issue of robustness of the calibration technique to temperature and other conditions and the ability to access all possible tuning channels for the tunable laser. Further, many existing techniques for tunable lasers have been reported in open literature, where a voltage of a diode section inside a laser cavity, for example, a gain section, may be used. For example, the voltage of the gain section may be monitored for voltage drops or minima values which represent points where the tunable laser is outputting a maximum power at the point. From this process, in one implementation, a gain voltage tuning map similar to the one as shown in FIG. 2 may be generated, and subsequent steps may be needed to perform to identify all of the minima in the gain voltage tuning map. Further, with respect to the minima in the gain voltage tuning map, optical output power values and associated wavelengths are measured using instrumentation, and if the tunable laser uses a fine tuning mechanism like a phase section, output wavelengths are further tuned and control values may be recorded.

This type of calibration (e.g., techniques based on the gain voltage tuning map) may be more robust and faster than using the wavelength only mapping (e.g., wavelength tuning map), in that first the gain voltage tuning map is generated using fast electronic instrumentation, and then after the identification of the minima in the gain voltage tuning map, only those control points are used to observe the wavelength outputs with external instruments, cutting down on a time limitation by the instrumentation. However, it is noted that the gain voltage map may be noisy, and single point interpretation times may need to be increased, as well as that the minima finder of the gain voltage map may randomly distribute points.

Another limiting factor in the fast wavelength and laser calibration in the existing technology arises from a basic design of the tunable lasers. Tunable lasers have been designed to extract the maximum energy out of one of laser facets (or mirrors), and therefore, the calibration routines must be performed based on optical signals extracted from one facet. Full information of laser tuning with two or more mirrors and possibly a phase current section may be used to tune, but the calibration algorithm and technique may be limited when only one mirror is accessible.

The present technology described herein overcomes these limitations in part because of use of full design features of tunable lasers. That is, the present technology use optical energy extracted out of multiple facets (e.g., two or more facets or mirrors) of a laser cavity. In the example, the ability to access multiple facets (e.g., two or more facets or mirrors) in the calibration process may provide fundamental advantages over the existing technology that has access to only one facet (mirror). Other aspects of the present disclosure that overcome the limitations may include an ability to utilize, in combination with multiple output facets (with or without an integrated optical data modulator), gain-voltage maps, minima search algorithms, fast curve fitting algorithms, interfacing of test and measurement equipment to rapidly collect only necessary data, and algorithms based on collecting tuning data from multiple mirrors using on-chip optical amplifiers as sources. As a result, the present technology described herein significantly speeds up the overall calibration process and enables a multi-stage process, thereby significantly decreasing a calibration time to an order of minutes for tunable lasers capable of tuning to large channel counts (e.g., over 80 channels) at a variety of channel spacing (e.g. 6.25 GHz, 37.5 GHz, 50 GHz, 100 GHz, for example).

In the present disclosure, four example methodologies or algorithms are described, all of which may be used alone or in combination with others, in various aspects of the present technology. The illustrated four methodologies are provided herein as only exemplary cases. As such, the present disclosure is not limited only to these disclosed methodologies in this form, but may include other variations and methodologies that leverage the laser design and essential aspects of the present disclosure in other combinations.

The present technology described herein further provides orders of magnitude improvement over existing techniques and is enabled by the tunable laser design in which two or more facets are accessible at a chip output, during a calibration process of a tunable laser. Further, using on-chip optical sources, such as semiconductor optical amplifiers (SOAs), the present technology described herein may enable wafer level scale testing of one of first stages of calibration, thereby significantly cutting down on the cost to test over full calibrations which are done at an individual die or chip on a carrier level.

Another reason for having fast wavelength calibration algorithms is for tunable lasers for coherent communications. The linewidth and optical output noise of the tunable lasers may be critical for a coherent (and other) communications systems, which may be limited in part because of the noise of a current source that tune various sections of the tunable laser. There are alternate approaches to tuning of the tunable laser which may replace or augment the current tuning, for example, heating a laser tuning section of the tunable laser. However, any type of temperature control of tuning (e.g., thermal tuning techniques) is orders of magnitude slower than a current controlled approach, and as a result, a wavelength calibration routine based on the temperature control may be slowed down to an unacceptable level, thereby greatly driving up the cost and time to manufacture. Fast wavelength calibration methods, algorithms, and apparatus as enabled by the present technology described herein are thus extremely important for lowering the cost of manufacture and improving the manufacturability of tunable lasers for coherent communications.

As noted above, the present technology is in part enabled by a unique aspect of a tunable laser (e.g., a tunable u-laser) or a general class of tunable lasers in which more than one optical output facet (e.g., multiple facets) are accessible at an output. During the calibration of the tunable laser, the multiple facets are used in conjunction with algorithms and hardware, such as a field programmable gate array (FPGA), to decrease significantly an amount of complexity and time for the wavelength calibration and also to decrease the expense and use of time consuming, test equipment and procedure.

An aspect in accordance with the present disclosure is utilization of a laser structure in which two or more laser mirrors (or facets) are accessible to an optical output for calibration instrumentation and algorithms. In a case of a tunable laser integrated with an optical data modulator, both mirrors of the tunable laser may be accessible to the optical output and the calibration instrumentation.

Another aspect in accordance with the present disclosure is gain-voltage tuning maps may be used in combination with various stages of mirror tuning and other tuning mechanisms within a laser cavity of the tunable laser, and/or further in combination with tuning fit algorithms and various stages of calibration designed to reduce the overall calibration time.

Another aspect in accordance with the present disclosure is that on-chip optical sources, such as optical amplifiers may be used in providing information, via a primary optical chip output, regarding tuning characteristics of laser mirrors and any internal laser tuning sections such that the wavelength calibration process is performed with a linear mirror scan and/or tuning curves of greatly reduced complexity over preforming a full map of all control vs. wavelength map points.

Another aspect in accordance with the present disclosure is that one or more image processing techniques may be used in identifying minima or maxima in gain voltage tuning maps to speed up identification of laser tuning points using rapid mapping techniques and equipment, relegating the slower portion of calibration to later stages in the calibration process where fewer points are tested and measured using slower test and calibration equipment.

Another aspect in accordance with the present disclosure is to leverage embedding calibration routing in hardware level gates, such as an FPGA, and even the same FPGA where data is stored, which may lead to an increase in manufacturing efficiencies, a reduction in costs, and an increase in flexibility in which the wavelength calibration is performed, e.g., during the manufacturing, system integration and even post deployment of the tunable lasers.

Another aspect in accordance with the present disclosure is that a set of methodologies or algorithms may be used either stand alone or in combination, which are enabled by access to multiple facet outputs of a tunable laser and the embedding of wavelength calibration in hardware gates, e.g., the FPGA.

Another aspect in accordance with the present disclosure is that stand alone or in part super-mode beating may be used to trace boundaries of sweet operating points. This methodology or algorithm, for example, can map 100 ITU channels in about ten minutes using a fast wave meter.

Another aspect in accordance with the present disclosure is to utilize a mirror reflection calibration that is enabled by the tunable laser with more than one facet (mirror) available to an algorithm. This example technique may reduce the mapping complexity from an $N^{-2}$ point problem to a 2N problem, and thus may fully map the power integrated circuit (PIC) in several minutes.

Another aspect in accordance with the present disclosure is that one or more benefits may be obtained when the present technology is used for calibrating wavelengths of the tunable lasers in which the low linewidth and optical output noise of the tunable lasers is critical for a coherent (and other) communications systems, particularly where slow tuning mechanisms are used like heating the laser tuning sections.

Another aspect in accordance with the present disclosure is to combine with one or more of the techniques or methodologies disclosed herein, and enabled by advantages of the tunable lasers having multiple facet outputs. For example, use of a gain-voltage map may be combined with on-chip integrated semiconductor optical amplifiers (SOAs) which are reverse biased as detectors and connected to each of primary laser outputs, and the outputs are simultaneously available at a photonic integrated circuit main output. Alternatively or in addition to, the present technology disclosed herein may also be used with off chip detectors; however, embedding of amplifiers (e.g., SOAs) that serve as detectors at the output of each laser mirror enables in-situ monitoring of a balanced laser output to be correlated with the gain-voltage tuning map, and map laser tuning properties based on a gain section voltage and optical output power. The present technology disclosed herein is significantly fast when combined with fast current source meters and fast wave-meters when current injection tuning is used.

Another aspect in accordance with the present disclosure is a merging of multiple techniques in a pipeline manner, in which the fastest techniques are applied to stages where large volumes of data must be collected, and then the slower techniques or measurements are applied to stages of calibration when a data set can be greatly reduced. In one implementation, a fast calibration of all accessible tuning points may be performed using any or a combination of the above techniques, where an actual wavelength is not known or other parameters, such as a side mode suppression ratio (SMSR), and the once more restricted set of desired channels and control set point are known, and a final sweep is performed with a slower instrument, such as an optical spectrum analyzer (or a fast parallel channel optical spectrum analyzer) is used to determine final characteristics of each channel.

Another aspect in accordance with the present disclosure is tracing of wavelengths using image processing to refine locations of control tuning points for desired channels from maps generated with any of the above or a combination of the above techniques or other techniques. For example, where a gain section is set to a constant current level required for an optimum optical output, SOAs may be reverse biased so as to act as detectors for an output optical power. The variation of mirror currents may tune the tunable laser resulting in peaks at various wavelengths with differing output powers. A map of SOA photocurrent on any one of the SOAs with varying mirror currents (e.g., one shown in FIG. 3) shows mode hops corresponding to the mirror sections and gain section. On a plot of SOA photocurrent to mirror currents (will be referred to herein as a "SOA Map"), these hops overlap to form "blocks." The centers of these blocks form ideal points of operation for tuning the tunable laser.

In an aspect in accordance with the present disclosure, various methodologies or algorithms may be used as a standalone or in combination thereof, for calibrating tunable lasers. In the description below, various methodologies are presented in accordance with aspects of the present disclosure, including a gain-voltage map algorithm, a gain-voltage and SOA photocurrent map algorithm, a mirror reflection algorithm, and a mode-hoping algorithm, each of which may be implemented alone or in combination with other algorithms.

[Gain-Voltage and SOA Photocurrent Map Algorithm]

As noted above, by way of example, in an aspect of the present disclosure, a SOA photocurrent map or a combination of a gain-voltage map and the SOA photocurrent map may be used for a wavelength calibration process. In the example, wavelengths may be extracted using image processing and computer vision functions from an image map of optical amplifiers (e.g., SOA maps). The optical amplifiers may be located on the same chip, or off chip, with a tunable laser but outside accessible two or more laser mirrors, to monitor photocurrent variations with varying mirror currents as a stand-alone measurement or in combination with a gain-voltage map.

In the example, a gain section of a tunable laser may be set to a constant current level required for an optimum optical output. The photonic integrated circuit (PIC) may be configured to contain multiple SOAs connected to each of laser mirror outputs such that an optical output power from each laser facet may be monitored using the SOAs as photodetectors by applying an electrical reverse bias. The variation of mirror currents may tune a laser optical output wavelength resulting in peaks at various wavelengths with differing output powers. A map of SOA photocurrent on any one of the SOAs may be obtained, corresponding to varying mirror currents and optical outputs for an associated laser mirror.

Figure 3:
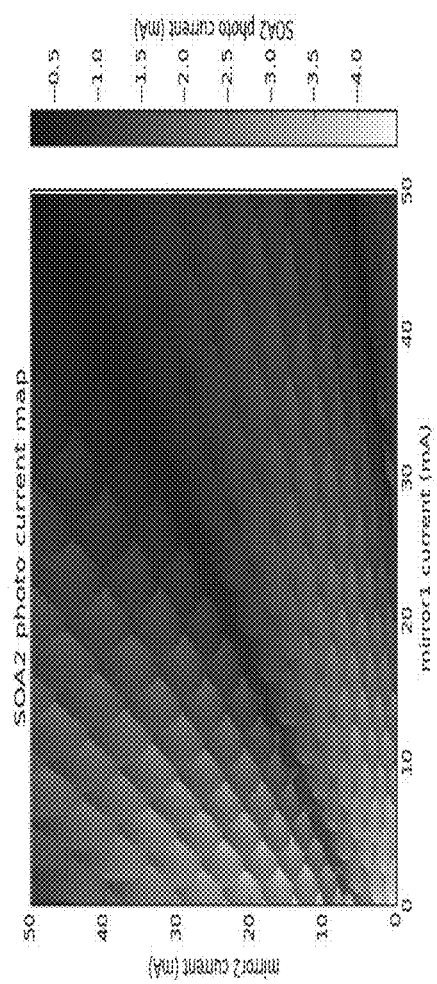
FIG. 3 is a diagram illustrating an example of a semiconductor optical amplifier (SOA) photocurrent map in accordance with an aspect of the present disclosure.

A feature of quasi-continuous tunable lasers may include mode-hoping, in which the optical output jumps from one wavelength to another, at times through a series of multiple wavelength peak outputs. In the example, the SOA tuning map may show mode hops corresponding to the mirror sections and gain section. As shown in FIG. 3, on the plot of SOA photocurrent to mirror currents (e.g., SOA Map), these mode hops overlap to form 'blocks' or zones with surrounding peak contours and valleys with minima located somewhere near a center when the zone is symmetric. Thus, the centers of these blocks (e.g., near valleys with minima) in turn form ideal points of operation for tuning the tunable laser. However, the zones are not often symmetric, especially across a map, and determining one or more locations of the minima is one aspect of the present disclosure that is sped up in terms of local ideal operating minima operation points.

Figure 4A:
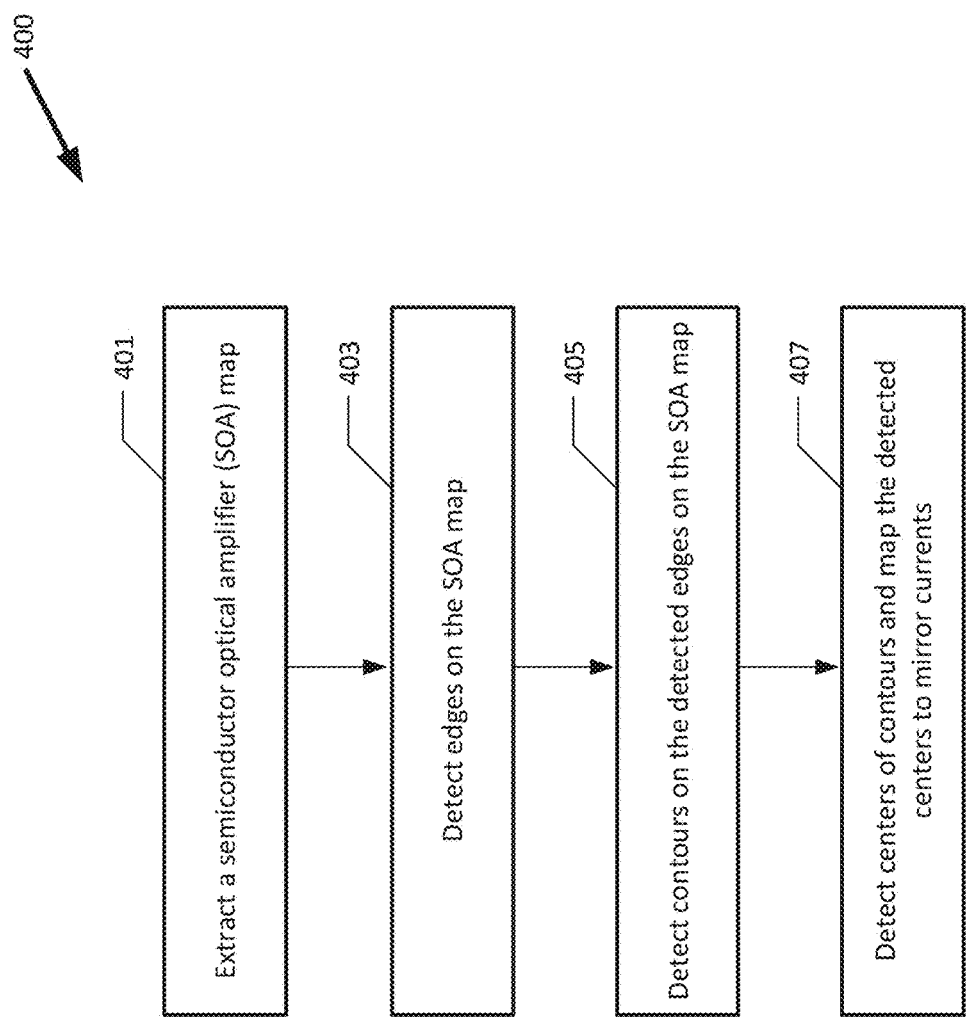
FIG. 4A is a flowchart illustrating an example of extracting wavelengths in accordance with an aspect of the present disclosure.

In another aspect in accordance with the present disclosure, an example methodology or algorithm may be used to determine the centers of the block by image processing of a SOA photocurrent map. In the example, the algorithm may include the following four steps: (i) the SOA photocurrent map is obtained, (ii) edge detection is performed on the obtained SOA photocurrent map, (iii) contour detection is performed on an image obtained in Step (ii), and (iv) center detection of the contours is performed and the detected centers of the contours are mapped to mirror currents for points of operation for tuning the tunable laser. An example of a process flow for the algorithm is illustrated in FIG. 4A. FIGS. 4B-4D also show examples of SOA photocurrent maps subject to edge detection and contour detection.

Referring back to the process flow as shown in FIG. 4A, at 401, a SOA photocurrent map is first obtained or extracted. By way of example, electronic circuit such as a processor, a microprocessor, or a FPGA, or the like is used to build the SOA photocurrent map. For example, as shown in FIG. 4B, for a second optical amplifier (e.g., SOA2) a SOA2 photocurrent map is obtained with varying mirror currents (e.g., Mirror 1 current, M1, and Mirror 2 current, M2).

At 403, by performing image processing via electronic circuit such as one or more processors, a FPGA, or the like, edges may be detected on an image of the SOA2 photocurrent map. Generally, wavelength hops may translate into boundaries (or edges) of blocks or contours on the image of the SOA2 photocurrent map. With appropriate image thresholds, the boundaries can be detected quickly and easily, using various feature detection techniques, for example, techniques and/or algorithms used in a field of computer vision. An example of an edge detection technique that may be used includes a canny edge detection method.

Further, the efficiency of the edge detection is generally determined by validity of detected edges of the blocks, which in turn may depend on the image thresholds. The image thresholds used for edge detection may then be calibrated based on an output optical power. It is noted that the image thresholds may not be constant across an entire sweep range of mirror currents of the SOA2 photocurrent map.

At 405, after detecting the edges of the blocks, contours may be detected, via the image processing, on the detected edges of the SOA2 photocurrent map. Also, the detected contours are drawn back on the image of the SOA2 photocurrent map. In the example, only closed contours are of interest, as the closed contours represent the blocks formed by mode hops, as shown in FIG. 4D. By way of example, the electronic circuit such as the one or more processors, microprocessors, or FPGAs, or the like may be used to detect the contours on the image of the SOA2 photocurrent map.

At 407, a center of each valid contour may be determined, via the image processing, based on image moments. Each valid contour is further processed to determine a center of the valid contour. The determined center of the valid contour then may be mapped back to the mirror currents with accuracy up to sub-pixels, as shown in FIG. 4E. By way of example, the electronic circuit such as the one or more processors, microprocessors, or FPGAs, or the like may be used to determine the centers of the detected contours on the image of the SOA2 photocurrent map. The mirror currents associated with the determined centers correspond to lasing wavelength peaks.

[Mirror Reflection Algorithm]

Alternatively, or in addition to, a mirror reflection algorithm may be used alone or in combination with other algorithm(s) for the wavelength calibration process. In an aspect of the present disclosure, by way of example, emission wavelengths of a dual optical tunable laser with two sampled grating distributed Bragg reflector (SGDBR) mirrors may be mapped via one or more techniques disclosed herein. It is noted that the one or more techniques depend on the ability to access both emission facets of the tunable laser. Further, the tunable laser may or may not have Semiconductor Optical Amplifiers (SOAs) after the mirrors. Also, the SOAs may be part of the PIC or disposed outside the PIC and coupled to the tunable laser.

Two example configurations of a tunable laser with two or more SOAs (corresponding to multiple mirrors) are shown 5A and 5B. The general principle is to measure reflection spectra of Mirror 1 and Mirror 2 of a tunable laser at various tuning states and to calculate required settings to set the tunable laser to a desired wavelength for lasing. Refractive index tuning of the mirrors (e.g., Mirror 1 and Mirror 2) and laser phase section can be performed by various techniques including current injection or thermally heating of an optical waveguide of the tunable laser.

Figures 5A, 5B:
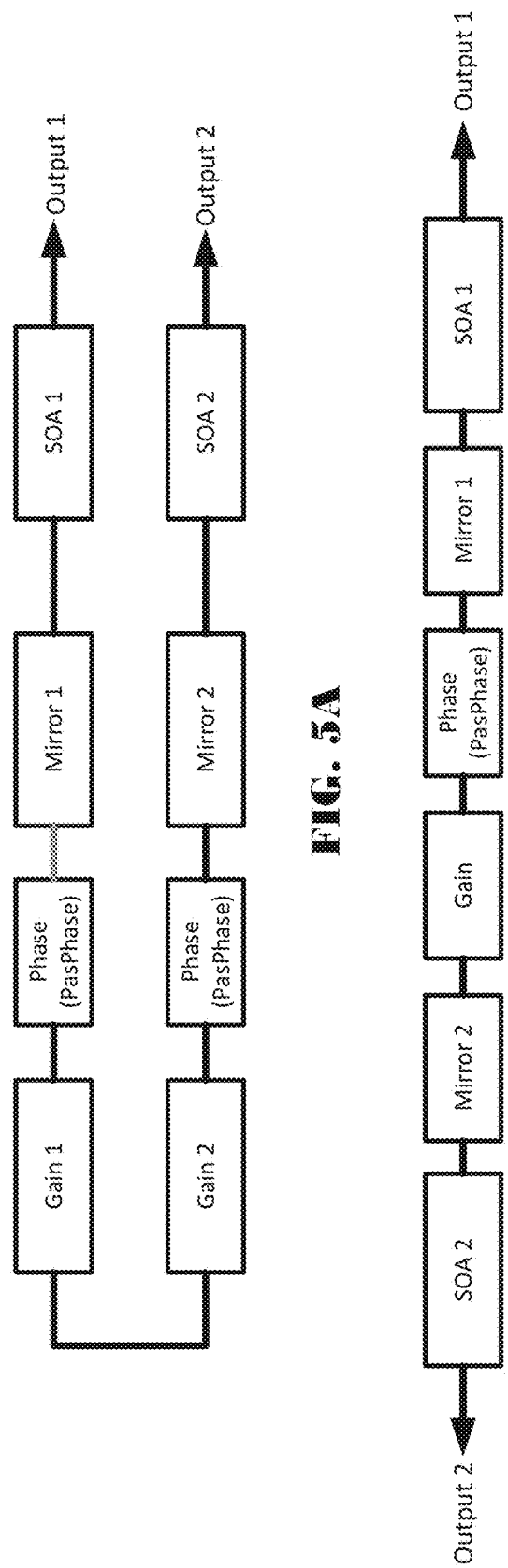
FIGS. 5A and 5B are block diagrams illustrating example configurations of a tunable laser in accordance with another aspect of the present disclosure.
Figure 7:
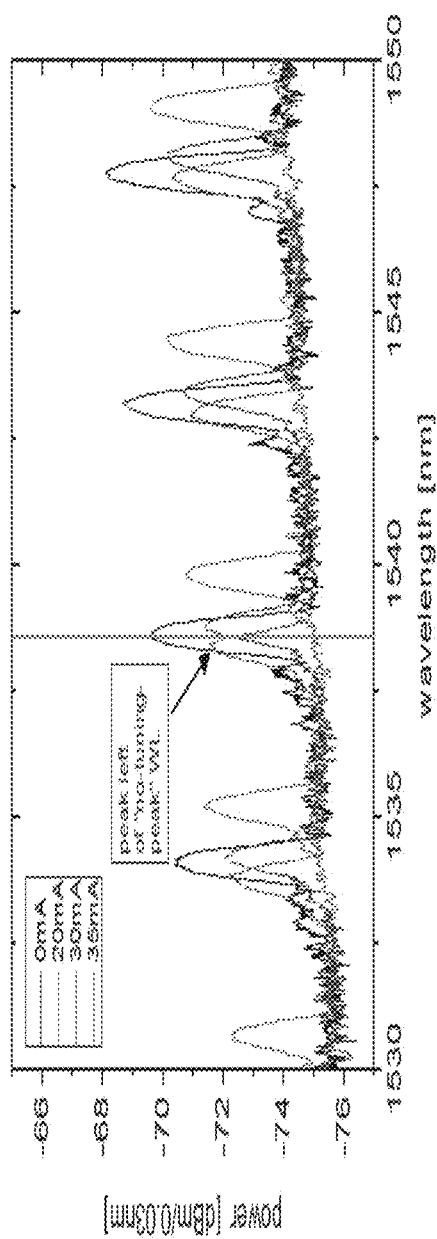
FIG. 7 is a graph illustrating an example of mirror reflection spectra in accordance with an aspect of the present disclosure.

In the example, although it is not necessary, a procedure to acquire mirror reflection spectra of the tunable laser is identical for both mirrors. In the discussion below, a method to measure the mirror reflection spectra for Mirror 1 is described. By way of example, in one implementation, SOA1 is forward biased to generate amplified spontaneous emission (ASE). The gain section (or two in FIG. 5A may be reverse biased or, if the reverse bias is not available, biased to 0 mA to provide absorption. SOA2 is reverse biased or, if the reverse bias is not available, biased to 0 mA to provide absorption. The reflection spectra of Mirror 1 may be recorded via an output point associated with SOA1, e.g., Output 1. FIG. 6A illustrates reflection spectra of Mirror 1 without a wavelength tuning process. In the example, the reflection spectra are recorded at different tuning steps at multiple mirror currents for Mirror 1 (e.g., at 0 mA, 5 mA, 15 mA, and 25 mA), as shown in FIG. 6B. The maximum tuning step should be such that reflection peaks have shifted so far that they overlay with a neighboring peak from a spectrum without tuning. As such, these FIG. 7 illustrates an example that where peaks at 35 mA tuning current overlay with peaks with no tuning current (e.g., at 0 mA) applied. Thus, 35 mA may be the maximum tuning step.

Similarly, data similar to those for Mirror 1 may be obtained for Mirror 2 by using the ASE from SOA2 and measuring mirror reflection spectra on an output point associated with SOA2, e.g., Output 2. In this case, SOA1 may be reverse biased or, if the reverse bias is not available, biased to 0 mA to provide absorption.

Figure 8:
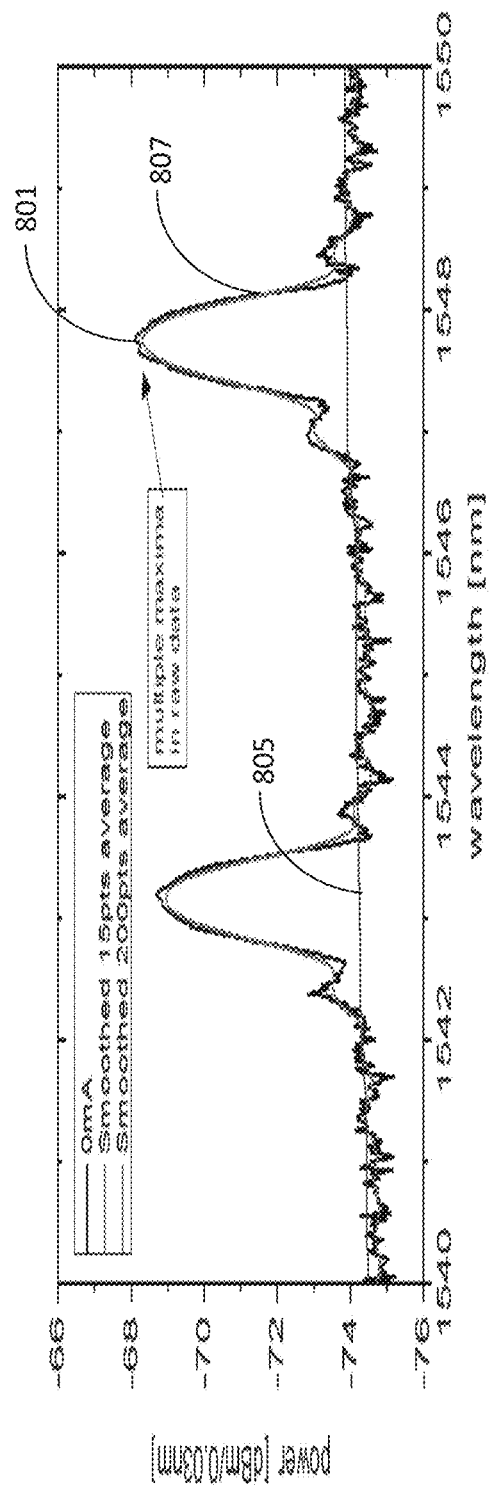
FIG. 8 is a graph illustrating an example of mirror reflection spectra in accordance with an aspect of the present disclosure.

Further, every single reflection peak is extracted or determined based on the obtained or collected data including mirror reflection spectra. In the example, however, the data collection method needs to guarantee presence of single reflection peaks, or the data need to be further processed to produce a reflection peak, e.g., being smoothed out to avoid multiple maxima in one reflection peak. By way of example, raw data may include two maxima in one peak 801 as shown in FIG. 8. In such a case, a smoothing or averaging operation is performed on the raw data to produce a smoothed curve, e.g., a fifteen points (15 pts) averaged curve 807 or a two hundred points (200 pts) averaged curve 805.

In the example, as noted above, from each measured mirror reflection spectrum an individual peak wavelength may be extracted using various signal processing operations. For doing so, any peak detection algorithm including various averaging methods may be used. To facilitate peak detection and/or extraction, underlying ASE may be subtracted from each measured mirror reflection spectrum. Also, for an underlying ASE spectrum each measured mirror reflection spectrum may be smoothed out such that no peak is visible in the data, e.g., a smoothed curve 805 resulting from the 200 points averaging method.

Figure 9:
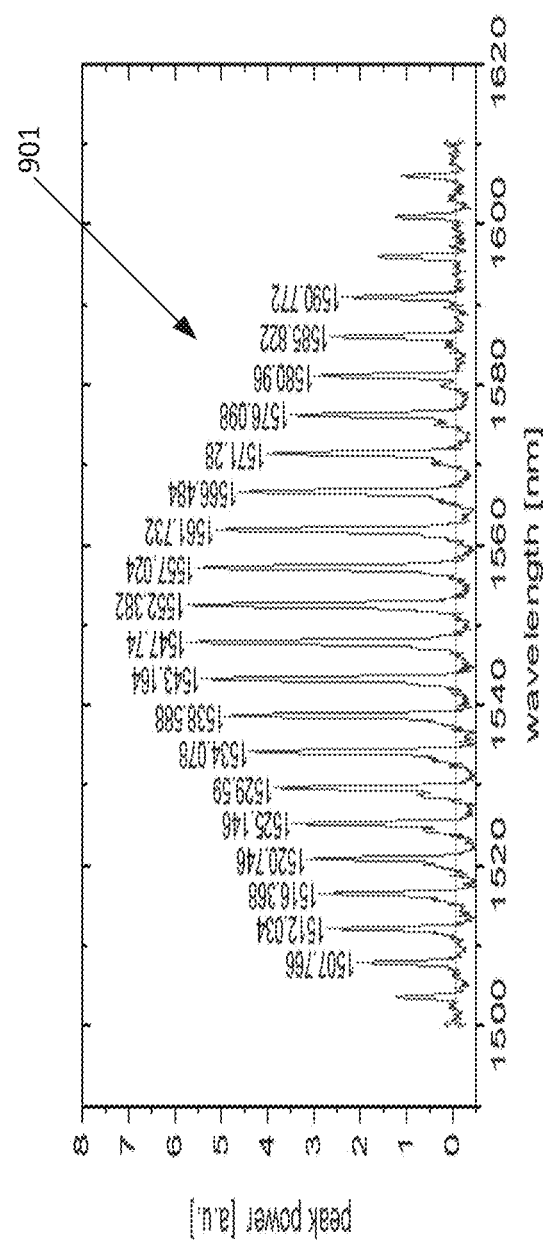
FIG. 9 is a graph illustrating an example of mirror reflection spectra in accordance with an aspect of the present disclosure.

FIG. 9 shows a mirror reflection spectrum in which the underlying ASE spectrum is determined and subtracted from the mirror reflection spectrum. In the example, the mirror reflection spectrum 901 is obtained by subtracting the spectrum of the 200 pts averaged curve from the spectrum of the 15 pts averaged curve as shown in FIG. 8. As can be seen, when the mirror reflection spectrum with the subtracted ASE is plotted with measured peak wavelengths, a peak detection algorithm may be used to detect a wavelength value of every peak.

Figure 10B:
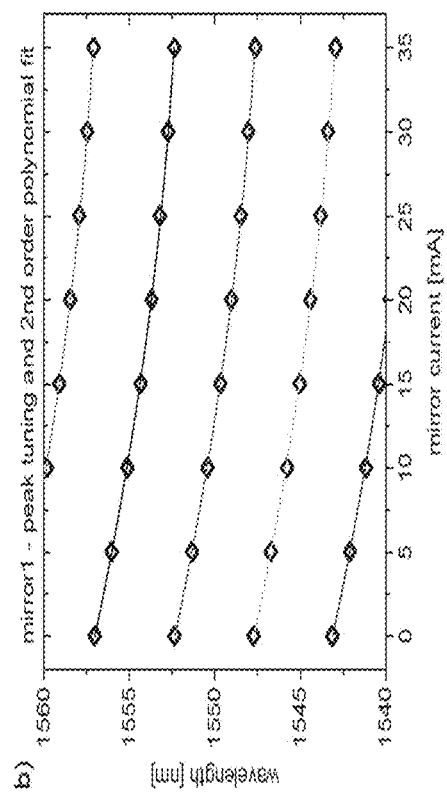
FIGS. 10A and 10B are graphs illustrating an example of wavelengths over tuning currents in accordance with an aspect of the present disclosure.
Figure 10A:
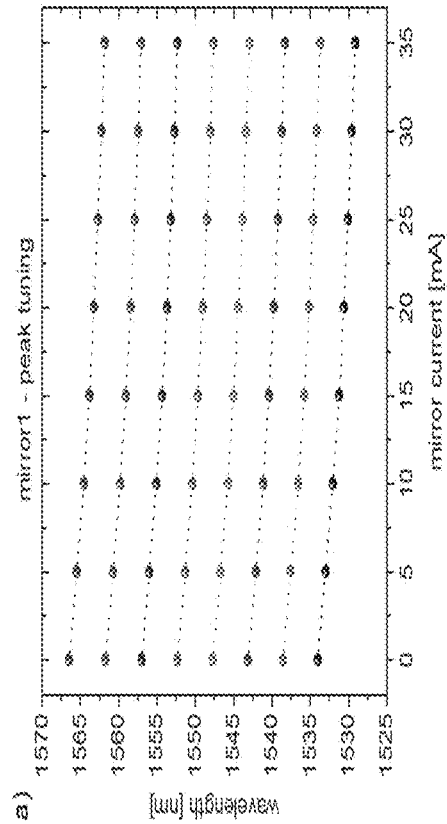

The next step to get a full wavelength calibration map is to plot the peak wavelengths against a plurality of tuning currents or tuning heater power values or against a unit that is used to tune the mirrors of a tunable laser. FIG. 10A shows a plurality of extracted peak wavelengths plotted against a plurality of tuning currents of mirror 1 of the tunable laser. In particular, by way of example, after plotting extracted peak wavelengths against a tuning current of mirror 1, a $2^{nd}$ order polynomial fit is applied for every trace shown in FIG. 10A. The polynomial fitted lines are shown in FIG. 10B. Similarly, an identical analysis is performed on the collected data for Mirror 2 of the tunable laser.

Figure 11:
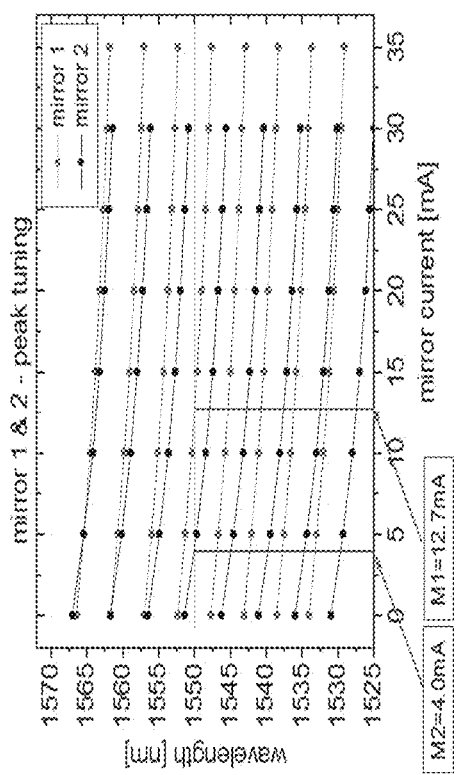
FIG. 11 is a graph illustrating an example of wavelengths over tuning currents in accordance with an aspect of the present disclosure.

Now, having the polynomial fitted data available for Mirror 1 and Mirror 2, any wavelength that is desired to set the tunable laser to can be determined or extracted based on the polynomial fitted data. FIG. 11 shows an example of such polynomial fitted data for Mirror 1 and Mirror 2. For the current tuning, a peak wavelength may be reduced with an increasing current. In order to extract a desired wavelength, one needs to choose the polynomial fitted data set of both mirrors that starts at a higher wavelength and calculate a required current to exactly set the mirrors to that desired wavelength. By way of example, using the polynomial fitted data shown in FIG. 11 for a desired wavelength of 1550 nm, the first mirror current, e.g., Mirror 1, is set to 12.7 mA (e.g., M1=12.7 mA) and the second mirror current, e.g., Mirror 2, is set to 4.0 mA (e.g., M2=4.0 mA).

Figure 12:
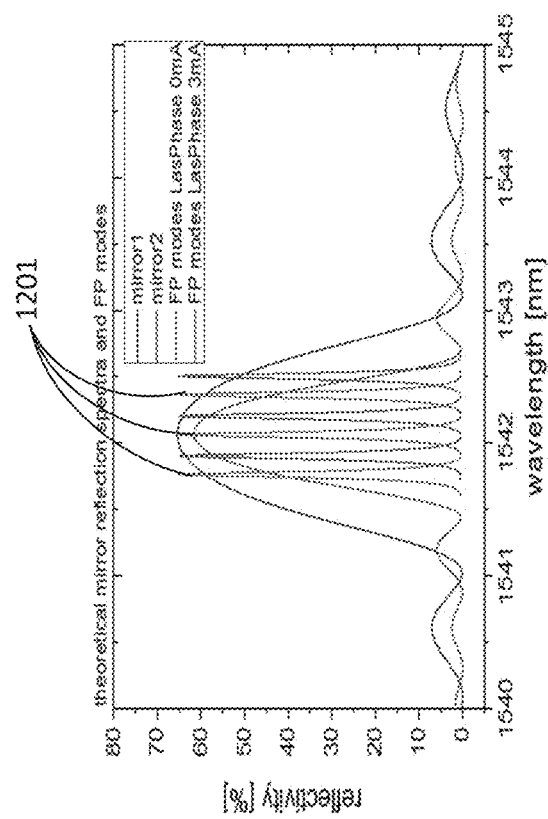
FIG. 12 is a graph illustrating an example of mirror reflection spectra in accordance with an aspect of the present disclosure.

Further, after Mirror 1 and Mirror 2 of the tunable laser have been aligned to the desired laser emission wavelength (e.g., 1550 nm), the Fabry-Perot (FP) modes need to be adjusted to perfectly match the desired emission wavelength. To do this, the phase section (e.g., LasPhase section) of the tunable laser needs to be tuned. Without the tuning of the LasPhase section, the FP mode may not be perfectly aligned. FIG. 12 shows a simulation result of an example of perfectly aligned mirror reflection peaks, assuming a desired emission wavelength of 1542.05 nm and simulated FP modes. It can be seen that for a tuning current of 3 mA on the LasPhase section, one FP mode perfectly aligns with the mirrors at 1542.05 nm, at 1201.

Mode-Hoping Algorithm

In an aspect of the present disclosure, alternatively or in addition to, a mode-hoping (or mode-hop or mode tracing) algorithm may be used alone or in combination with other algorithm(s) for tune wavelength calibration process. By way of example, a mode-hop or tracing algorithm is an algorithm for characterizing a widely tunable laser that has two SGDBR mirrors. One such laser is the U-laser which is described here as an exemplary case, but the mode-hop algorithm is applicable to other tunable lasers, particularly ones that have more than one output facet used to communicate to the output. In order to describe this calibration method, it is beneficial to understand how the U-laser works. The next section is a brief description of a concept that allows the wide tuning capability of a tunable U-laser. Further, a description of suggested calibration equipment is provided afterwards.

The ability of the tunable U-laser to be widely tunable is based on a setting of currents on its two SGDBR mirrors. The tuning of a cavity mode of the tunable U-laser allows for fine tuning of a laser wavelength. The SGDBR mirrors each produce a veneer of reflection peaks and a peak spacing of one mirror differs slightly from the other such that there is only one peak that is common between the mirrors at any time. When a wavelength of a reflection peak of one mirror matches up with a wavelength of a reflection peak of the other mirror, the tunable laser will lase at that wavelength. When the current and thus veneer peaks of one mirror shift relative to the other, the lasing wavelength will hop from one veneer peak to the next one that now matches up on both mirrors. When both mirrors are tuned together, it is possible to smoothly tune a distance between the veneer peaks. As such, in the example, with a combination of hopping and smooth tuning, it is possible to achieve full tunability over a wide range of wavelength. In the description below, the present disclosure will refer to this hopping and smooth tuning together.

The calibration can be performed with several different types of instrumentation, and examples are given here for illustration purposes. In one aspect of the present disclosure, current/voltage sources that can be controlled by an FPGA, a processor, a computer, or the like, as well as other instrumentation controlled including but not limited to an optical spectrum analyzer, wave-meter, or other similar tool that can measure the wavelength of the tunable laser and return this information to the same computer that controls the current/voltage sources are used.

Figure 13A:
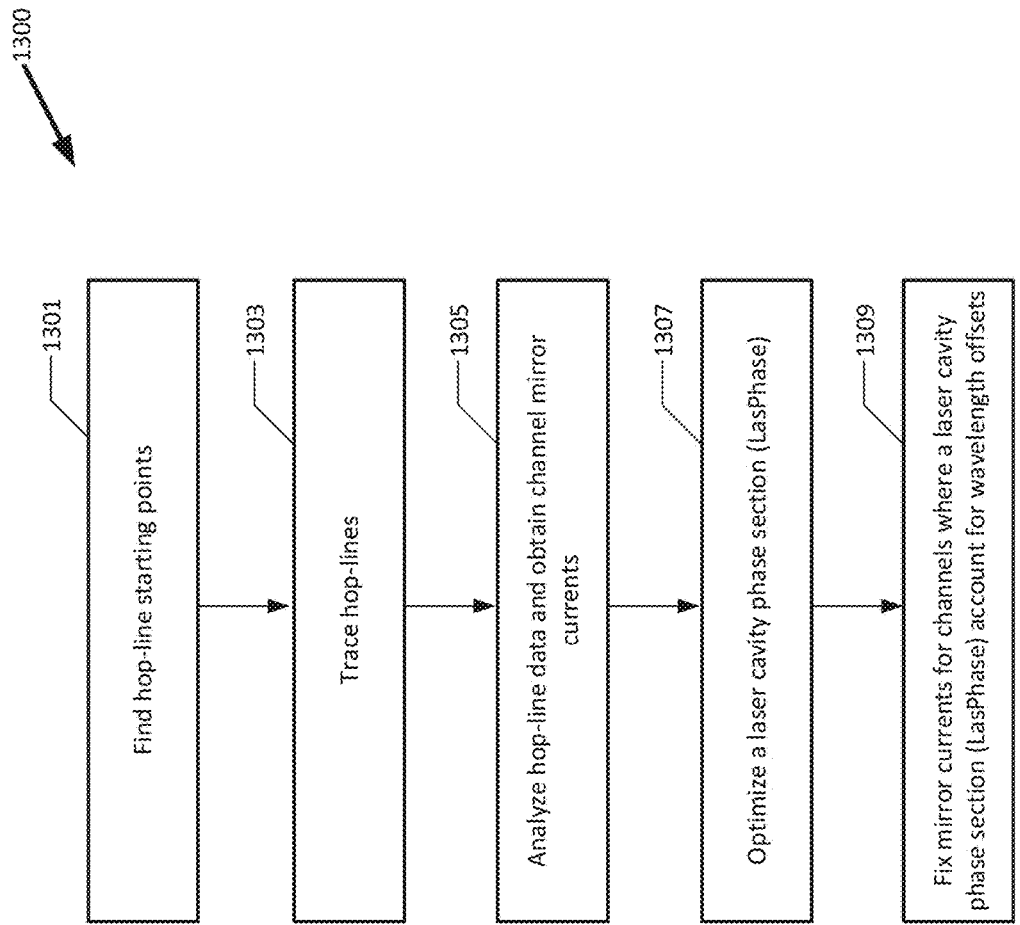
FIG. 13A is a flowchart illustrating an example of a process for mode-hop tracing in accordance with an aspect of the present disclosure.

FIG. 13A illustrates an example of a flowchart used in a mode-hop process. In an aspect of the present disclosure, the mode-hop process for a tunable laser having two mirrors may include the following steps or parts:

Step 1: Find hop-line starting points 1301,
Step 2: Trace hop lines 1303,
Step 3: Analyze hop-line data collected and obtain channel mirror currents 1305,
Step 4: Optimize a laser cavity phase section (LasPhase), and
Step 5: Fix mirror currents for channels where the LasPhase account for wavelength offsets 1309.

That is, a starting point of wavelength hops is found first at the first step 1301. Then, these wavelength hops are traced along a one-dimensional line of incrementally larger mirror currents on both mirrors at the second step 1303. As a third step 1305 analysis of data collected from the second step 1303 is performed in order to determine operating settings for desired, specific lasing wavelengths. An optimization of a cavity mode position of the tunable laser is then performed, which acts as a fine tuning of the lasing wavelength, at the fourth step 1307. As the fifth step 1309 a re-optimization of mirror currents for some channels is also performed. It is noted that in carrying out these steps electronic circuit including one or more processors, microcontrollers, field programmable gate arrays (FPGAs), application specific integrated circuits (ASICs), or other electronics that may be configured to perform logic functions, including any combination of both software and hardware components may be used.

Figure 13B:
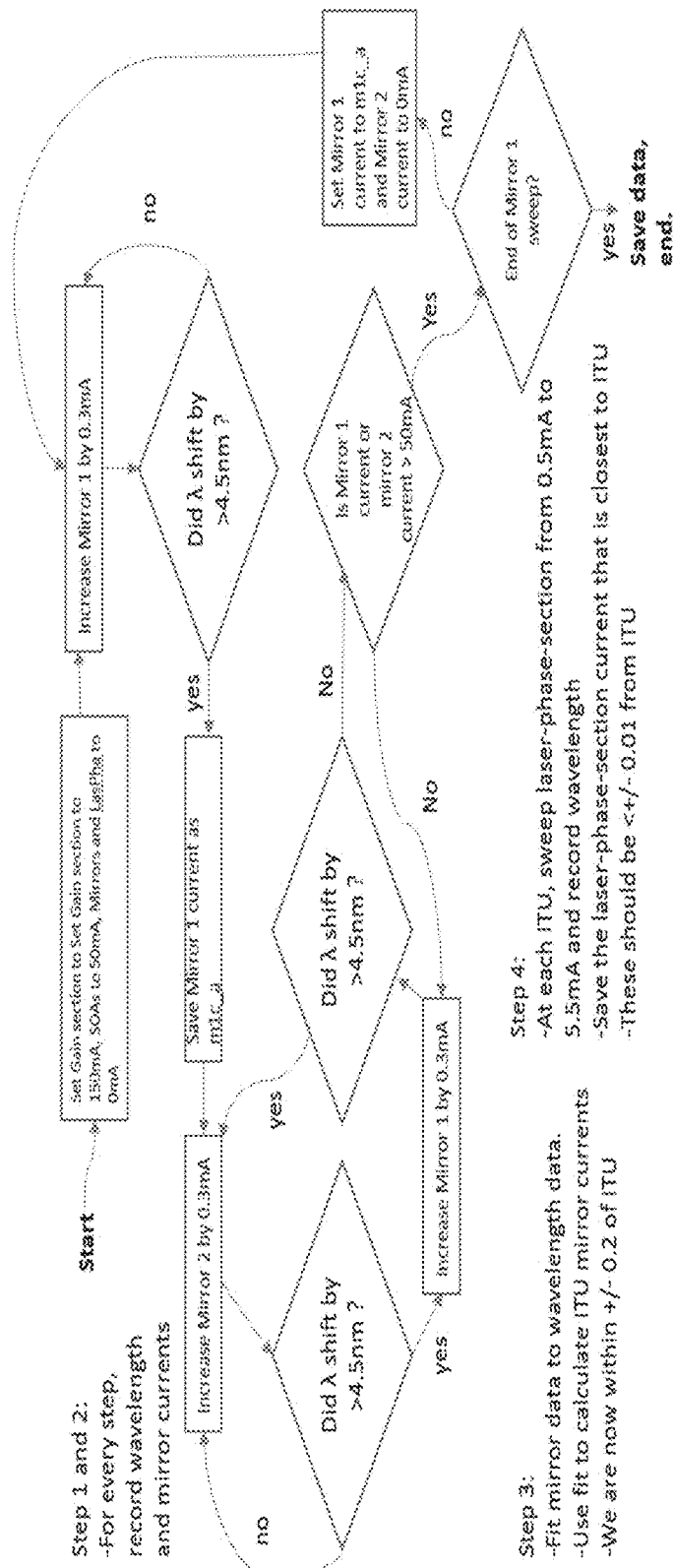
FIG. 13B is a chart illustrating an example of pseudo-code and a flowchart for performing the first four steps of the mode-hop process in accordance with an aspect of the present disclosure.

FIG. 13B illustrates an example of pseudo-code and a flowchart for performing the first four steps of the mode-hop process. By way of example, as noted above, the first step is to find at which mirror currents wavelength hops are produced. This can be accomplished by repeatedly making slight modifications to currents of the mirrors, measuring and recording the resulting wavelength and mirror currents. Here, it is noted that starting values of the mirror currents are essential parameters to choose, and one starting value of the mirror currents may include a zero current for both mirrors. In the present disclosure, the mirror currents may be interchangeably referred to as M1 (a mirror current for Mirror 1) and M2 (a mirror current for Mirror 2). Further, as noted above, M1 and M2 may be initially set to 0 mA.

In an aspect of the present disclosure, one approach is to repeatedly increase M1 by a certain current amount, e.g., delta, dI, while measuring resulting wavelengths at all steps. After each step, the wavelength will generally only change by a relatively small amount. If the wavelength changes by an amount similar to a spacing of a mirror veneer peak spacing, then it is determined that the location of a mode hop has been identified. This process may be illustrated in detail in FIG. 14. This resulting M1 and M2 current settings will be used as a starting point in a second step of the mode-hop process.

Alternatively, the mode-hop process may proceed to the second step for this starting point. It is also possible to continue to find starting points of the rest of the mode hops. To continue with this finding of mode hops, the value of M1 may be increased along a direction 1401 until a next mode hop is observed and then recorded. A process of increasing the value of M1 and recording noted hops is continued until a predetermined number of hops is determined and a limit on a maximum current has been reached for any of the mirrors. The mode-hop process may then cycle back to M1=0 mA and M2=0 mA and start the same process but now with leaving M1=0 mA, but incrementally increasing M2 by dI and recording noted hops along the new direction 1403. As a result, the process will generally find all mirror hop starting points.

Alternatively, there are other ways to do the same, such as going through along a line where M1=alpha−M2, and alpha is a constant related to mirror current limits. FIG. 14 conceptually illustrates a direction of scanning for M1 and M2 and a plurality of hop-line starting points found. As shown in FIG. 14, arrows represent a direction of scanning 1401 or 1403 and circles represent found hop-line starting points.

Figure 15:
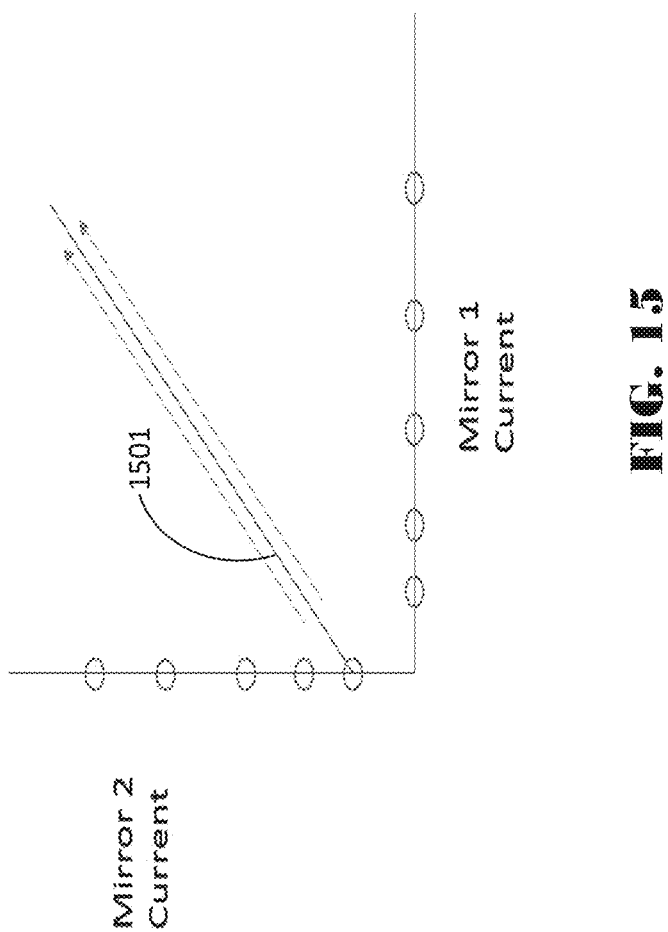
FIG. 15 is a graph illustrating part of the wavelength calibration process in accordance with an aspect of the present disclosure.

In an aspect of the present disclosure, an example of the second step in the mode-hop process is a tracing of the hop starting positions along a one-dimensional line of incrementally larger (or smaller) mirror currents on both mirrors, which is conceptually illustrated in FIG. 15. While tracing out this line 1501, the mirror currents and the wavelength of a lasing peak may be recorded. Depending on a method of tracing out the mode-hop lines, the power of a primary peak and the power and wavelength of a secondary peak may also be recorded. In the example, this hop-line is one dimensional because M1, M2, and wavelength are codependent for a particular hop-line. If a change in wavelength due to a change in the current of the mirrors were linear, M1 and M2 may be increased by the same amount and still be on the hop-line. However, this is usually not the case, so it is important to carefully adjust M1 and M2 to stay on the line. In one implementation, one way to do this is to increase only M1 until a hop is observed and then increase only M2 until a hop back in the other direction is identified. This process may continue between increasing M1 until a hop and then M2 until another hop, until we reach a predetermined wavelength or a current limit.

Alternatively, the task of tracing out the hop line may be performed by examining a ratio of the power of two lasing peaks that may occur during a hop. The ratio of two power levels may give guidance to an amount at which to increase M1 relative to an amount to increase M2 in order to stay on the hop-line. For whatever method is used to trace the hop-line, the tracing of the hop-line may be performed for each of the starting positions that are determined in the first step of the mode-hop process.

Figure 16:
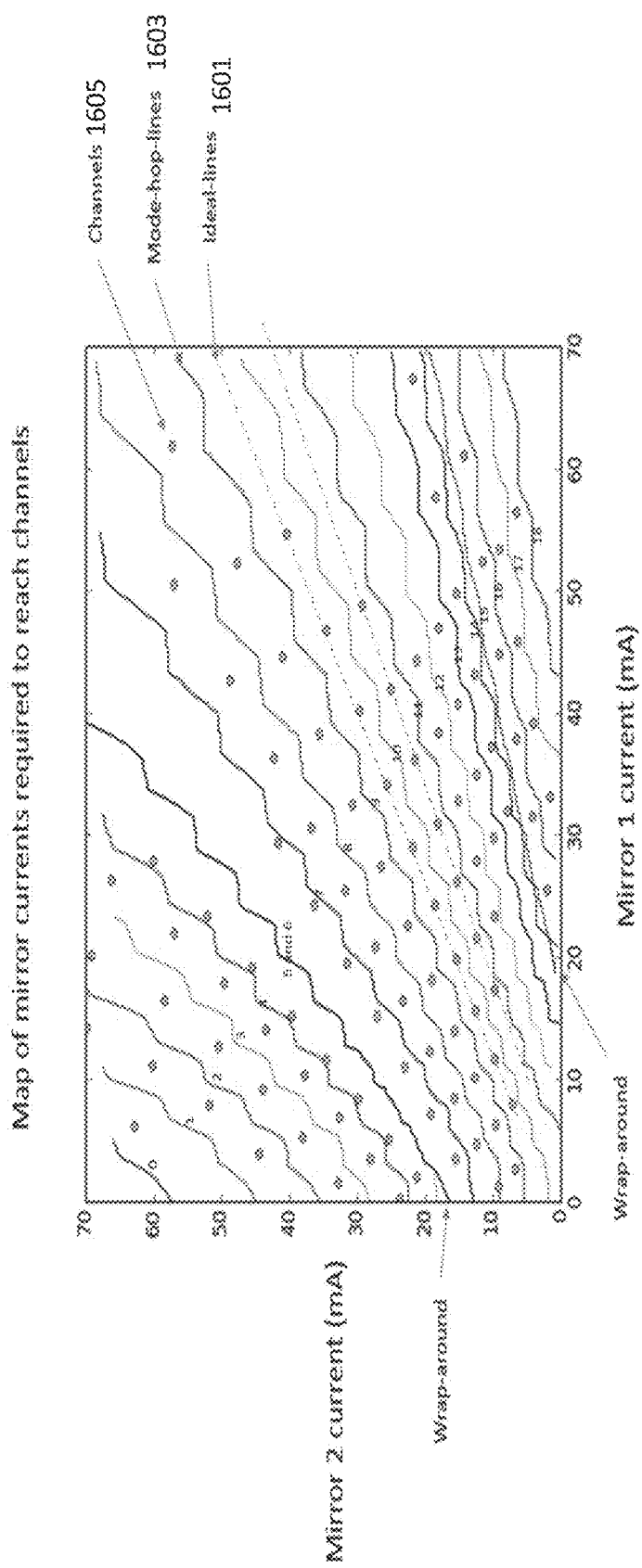
FIG. 16 is a graph illustrating part of the wavelength calibration process in accordance with an aspect of the present disclosure.

In another aspect in accordance with the present disclosure, an example of the third step of the mode-hop process is to perform an analysis of data resulted from the second part in order to determine operating settings for desired specific lasing wavelengths with the data representing the M1 and M2 values along the mode-hop lines for the tunable laser under calibration. FIG. 16 illustrates a conceptual map of mirror currents required for each channels 1605. In the example, it is important to keep away from the mode-hop lines 1603 as these are not ideal operating conditions. Better operating conditions may be found directly in between the mode-hop lines 1603. For example, the mode-hop lines 1603 run in similar directions to each other such that ideal conditions 1601 for laser operation also form lines which run directly between the mode-hop lines 1603. In the present disclosure, these lines of ideal operation will be referred to as ideal-lines. The ideal-lines (just like mode-hop lines) each comprise a one-dimensional codependent function of M1, M2, and wavelength. In the example, the one-dimensional codependent function that describes an ideal-line may be determined by averaging function parameters of the mode-hop lines 1603 that are on either side of the ideal-line 1601. The function parameters of the mode-hop lines 1603 are derived from a fit of the data resulting from the second step of the mode-hop process. Once the function parameters for all of the ideal-lines are found, the functions can be used to determine mirror currents required to set the tunable laser to any wavelength that is desired in a tuning range of the tunable laser.

Further, the function parameters may be stored in a look-up table for later use. Alternatively, the final currents of each desired wavelength may be stored in a look-up table embedded in hardware gates, such as in an FPGA. In one implementation in which a calibration routine is run on hardware of the FPGA, the methodology or algorithm, data collection and storage may all be performed with the same hardware based logic. Further, the processing and storage may be performed by extremely high speed, gate level based, concurrent processes that have significant advantages over the existing technology.

Figure 17:
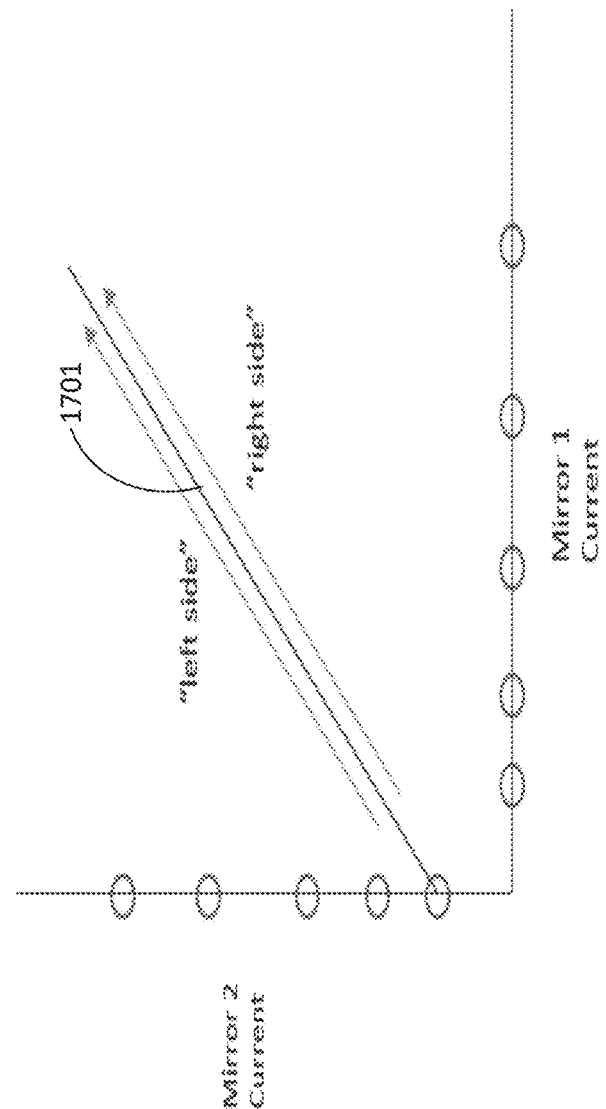
FIG. 17 is a graph illustrating part of the wavelength calibration process in accordance with an aspect of the present disclosure.
Figure 18:
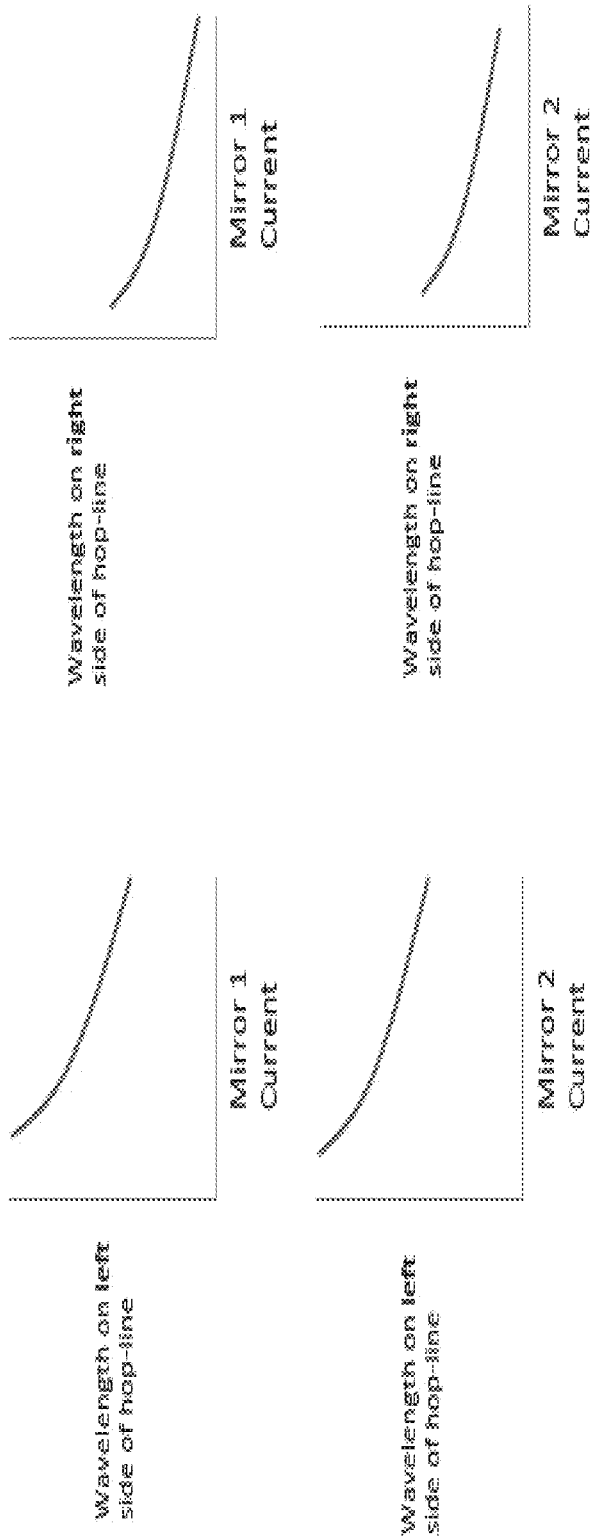
FIG. 18 is a graph illustrating part of the wavelength calibration process in accordance with an aspect of the present disclosure.

In an aspect of the present disclosure, it is also possible for data to be taken from both sides of each mode-hop line 1701 as shown in FIG. 17. In the example, M1 and M2 values will be somewhat similar on each side, but wavelength on each side will be separated by supermode spacing. In the present disclosure, the sides of the line 1701 are referred to as a "left side" and a "right side," where the terms "left" and "right" are set based on traveling along the line 1701 from low mirror currents to high mirror currents as shown in FIG. 17. The mode-hop lines starting at zero on the left-most line and incrementing up to the right-most line are labeled (see the numbers on the lines in FIG. 17.

In an aspect of the present disclosure, to describe the calculation of an ideal-line (e.g. 1601 in FIG. 16), a process for calculating the ideal-line between a mode-hop line 3 and a mode-hop line 4 should be understood. The right side of the mode-hop line 3 will have similar wavelengths to the left side of the mode-hop line 4. A curve fit, in this case, is performed as an example using a quadratic equation to the right side of the mode-hop line 3 for wavelength vs M1 and also wavelength vs M2. This curve fitting is then repeated for the left side of the mode-hop line 4 leading to a total of four equations. Each of the equations may be represented as a quadratic equation as shown below:

$$Y = AX^2 + BX + C$$

The four equations may be written using a four-character terminology for the above A, B, and C parameters. The first character is A, B, or C. The second character is the number of the mode-hop line. The third character is R or L which stands for the right side of the mode-hop line or the left side of the mode-hop line. The fourth character is either 1 or 2 for a curve fit of either M1 of M2.

As such, the four equations may be written as follows:

$$\lambda(\text{right side of mode-hop line 3}) = (A3R1)(M1)^2 + (B3R1)(M1) + (C3R1);$$

$$\lambda(\text{right side of mode-hop line 3}) = (A3R2)(M2)^2 + (B3R2)(M2) + (C3R2);$$

$$\lambda(\text{left side of mode-hop line 4}) = (A4L1)(M1)^2 + (B4L1)(M1) + (C4L1); \text{ and}$$

$$\lambda(\text{left side of mode-hop line 4}) = (A4L2)(M2)^2 + (B4L2)(M2) + (C4L2).$$

Then, two quadratic equations for the ideal-lines using averages of the above parameters may be determined as follows:

$$\lambda(\text{3-4 ideal line}) = (A1)(M1)^2 + (B1)(M1) + (C1);$$

$$\lambda(\text{3-4 ideal line}) = (A2)(M2)^2 + (B2)(M2) + (C2), \text{ where}$$

$A1=(A3R1+A4L1)/2$, $B1=(B3R1+B4L1)/2$, $C1=(C3R1+C4L1)/2$, $A2=(A3R2+A4L2)/2$, $B2=(B3R2+B4L2)/2$, and $C2=(C3R2+C4L2)/2$.

Finally, the quadratic formula may be utilized to obtain M1 and M2 as a function of wavelength for the two ideal-line equations and use this information to determine if there are any International Telecommunication Union (ITU) wavelengths on this line that have reasonable M1 and M2 currents (e.g., currents that are greater than 0 and less than the maximum mirror currents).

In an aspect of the present disclosure, the fourth part of the mode-hop process ⏋ is to optimize a cavity mode position of the tunable laser, which acts as a fine tuning of the wavelength. Tunable lasers including U-lasers and similar types of lasers are designed such that only one cavity mode can lase at a time. Thus, the position of this single lasing cavity mode need be aligned with a desired laser output wavelength of the tunable laser.

Figure 19:
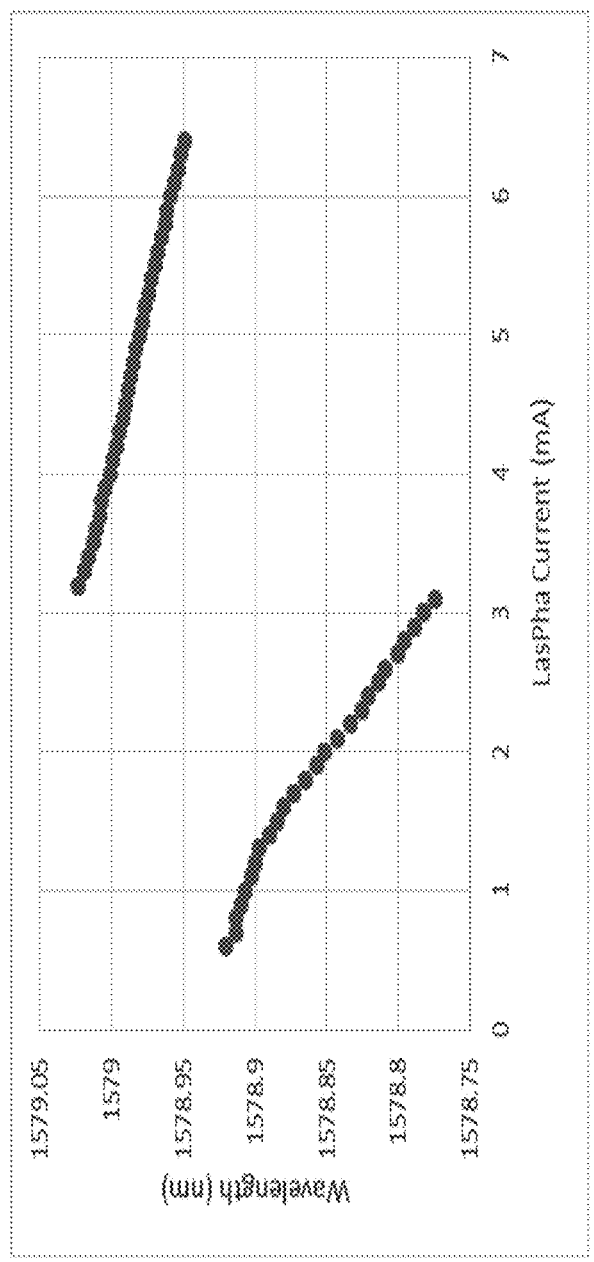
FIG. 19 is a graph illustrating part of the wavelength calibration process in accordance with an aspect of the present disclosure.

In one implementation, an alignment of a cavity mode is performed by sweeping a laser phase (e.g., LasPha) section current, while monitoring the wavelength. FIG. 19 illustrates typical data resulting from this step of sweeping the laser phase section current. As shown in FIG. 19, a discontinuity such as the one at 3.2 mA is noted when one cavity mode leaves an individual mirror reflectivity peak and the next one comes into it. According to an example shown in FIG. 19, if the tunable laser is desired to lase at 1578.9 nm, then the LasPha section current may be set to about 1.3 mA. This adjustment may be done automatically with a wavelength locker that is in a feedback loop where the wavelength locker adjusts the LasPha section current to maintain an optically calibrated desired laser wavelength. Also, the alignment of the cavity mode may be performed for all wavelengths and the parameters may be stored in a look-up table for operational use as described herein in the present disclosure.

It is also noted that a range between a maximum wavelength and a minimum wavelength shown in FIG. 19 may not include a channel that is to be mapped. This may happen if the mirror currents found in the analysis of the hop-line data are not correct. As such, in an aspect of the present disclosure, correction may be made to the mirror currents. That is, the correction for small offsets may be made to the mirror currents. By way of example, it is assumed that a desired output wavelength is 1579.1 nm. In this case, the mirror currents may be shifted using fit parameters that were calculated above (e.g., Step 3). First, it is estimated how far off the mirror currents are. Then, an average of the maximum and minimum wavelengths in FIG. 19 is determined to get an estimate of the location of the mirror peaks as follows:

max=1579.024 nm;

min=1578.789 nm;

Average of max and min=(1579.024 nm+1578.789 nm)/2=1578.907 nm;

Lambda offset=1579.1 nm−1578.907 nm=0.193 nm.

Next the change in mirror currents may be found for a change in wavelength using a derivative of the fit and solving for the change in mirror currents as follows:

$Y=AX^2+BX+C$, $dY=(2AX+B)dX$, $dX=dY/(2AX+B)$

Mirror offset=(Lambda offset)/(2*A*(mirror current))+B)

(*note this only is valid for small offsets)

As a result, the updated mirror currents may be determined as follows:

New mirror current=Old mirror current+Mirror offset

Figure 20:
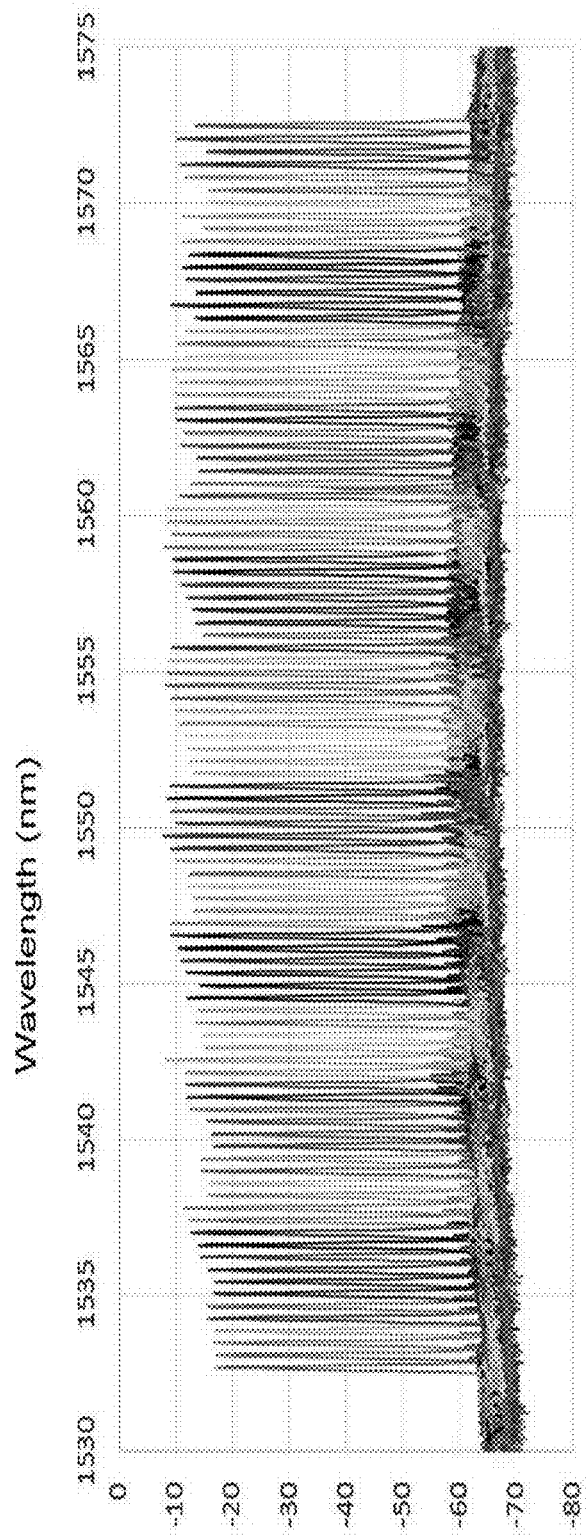
FIG. 20 is a graph illustrating part of the wavelength calibration process in accordance with an aspect of the present disclosure.

The same equation for both Mirror 1 and Mirror 2 may be used, but now let's use mirror 1 fit parameters for Mirror 1 and mirror 2 fit parameters for Mirror 2. Using these updates of mirror currents, step 4 is repeated for channels that needed a re-optimization to reach a tuning map minimum and reach the desired output wavelength channel. With the completion of step 5, the tunable laser may be tuned to any channel and may store mirror currents and the LasPha currents in a look-up table, via one or more processors, microcontrollers, FPGAs, ASICs or the like. FIG. 20 shows an example of a calibrated 100-channels tuning for a tunable U-Laser using the present technology described herein, obtained on the order of minutes.

Often, a major challenge in the wavelength calibration of tunable lasers is in a reduction of the calibration time to a level practicable for producing the tunable lasers in production quantities. Assuming, for example, that 10,000 units per month are to be produced and a production line runs 24 hours per day, calibrating units serially with perfect efficiency, the calibration time available per unit would be 30*24 (=720 hours/month) divided by 10,000 units (=0.072 hours/unit=4.32 minutes/unit). Parallel processing of production units reduces this problem of the calibration time, but also increases costs due to additional test equipment and personnel required for the parallel processing of the production units. As such, any reduction in the calibration time for the tunable lasers at a factory level may be of paramount importance. Furthermore, field and even in-service calibration or re-calibration of aged units that are already deployed in the field through SDN means that it may greatly reduce costs associated with any downtime and replacement.

Achieving these goals (e.g., a reduction in the calibration time) may require placing the intelligence that performs the calibration of the tunable laser closer to the tunable laser and reducing the cost/size/power of the electronics required to perform the calibration. By way of example, as described in the present disclosure, an FPGA-centric design may be used to implement various aspects of the present technology resulting in a significant amount of reduction in the calibration time of the tunable lasers. That is, using an FPGA and associated electronics in accordance with the present disclosure will greatly reduce the cost of an initial calibration at a factory and/or may also be implemented as part of the delivered product, enabling field calibration through SDN.

The methodology and hardware architecture as described herein may reduce the calibration time to under 10 minutes. However, shorter times by orders of magnitude may be desired for a further reduction of the cost of equipment involved. Often, a limiting factor to reducing such a calibration time is a processing overhead and data transfer bottlenecks associated with performing one or more calibration algorithms on a standard host (e.g., a computer including one or more processors) communicating over standard interfaces to commercial test equipment. Thus, the cost constraint may be often the test equipment, which can cost thousands of dollars per channel of laser electrode control. The present technology described herein may circumvent both of these limitations, while enabling use of new, efficient calibration methodology in delivered products (e.g., tunable lasers).

Figure 21:
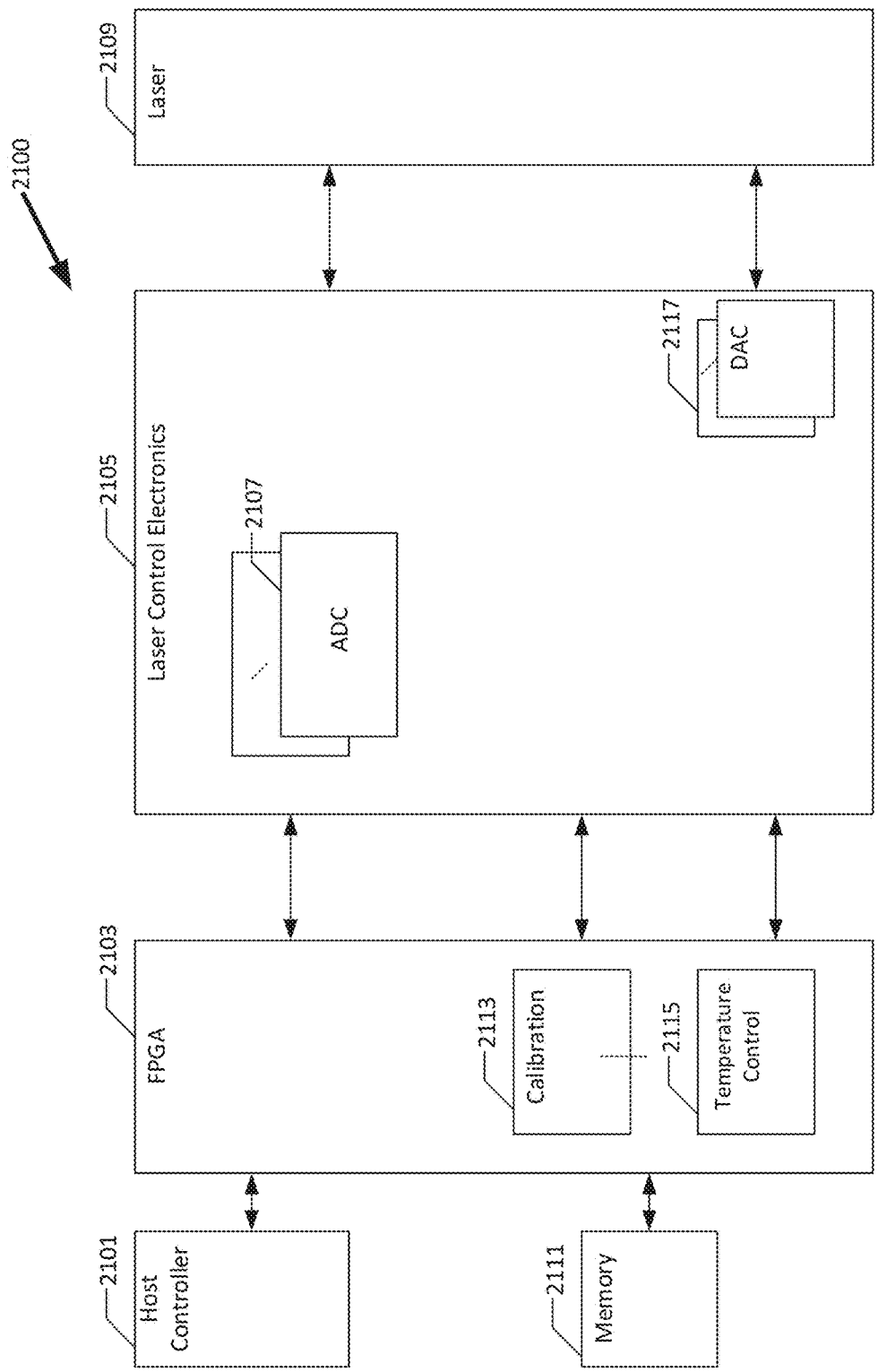
FIG. 21 is a diagram illustrating an example of a system in accordance with an aspect of the present disclosure.

The present technology including a method of performing wavelength calibration described herein may be implemented in hardware, software, or any combination thereof. In an aspect of the present disclosure, however, the present technology may be implemented as hardware acceleration. In the example, the intelligence of the calibration methodology may be placed in an FPGA, which may be then designed to perform the present technology in an optimized, dedicated fashion, off-loading the standard host processor and leaving it only a task of archiving and reporting on the resultant data set. FIG. 21 illustrates a block diagram conceptually showing components for a FPGA centric wavelength calibration. A system 2100 shown in FIG. 21 includes a host controller 2101, an FPGA 2103, laser control electronics 2105, a laser 2109, and a storage 2111. The host controller 2101 may be configured to communicate with the FPGA 2103 for various purposes including control and management, and also configured to receive data relating to calibration of the tunable laser 2109. In the example, the FPGA 2103 also drives the laser control electrodes 2105 through digital-to-analog converters (DACs) 2107 interfaced to the FPGA 2103 and connected to the tunable laser 2109. The FPGA 2103 may also include various components, including a calibration component 2113 and/or a temperature component 2115 for implementing various aspects of the present methodology described herein. Further, the FPGA 2103 may include an internal storage (not shown) and/or an external storage such as the memory 2111 coupled to the FPGA 2103 for storing various parameters including parameters for implementing the present technology. In an aspect of the present disclosure, the memory 2111 may include one or more look-up tables of data in connection with implementing various aspects of the present technology described herein.

In an aspect of the present disclosure, while it may incur an initial development cost, the system 2100 is vastly less expensive than the existing commercial equipment (e.g., commercial-off-the-shelf (COTS) equipment) over a lifetime of a product, as well as achieves vastly higher speeds.

Further, in one implementation of the present disclosure, e.g., the FPGA-Centric method of wavelength calibration may be performed as follows. The host controller 2101 may transfer code for one or more calibration algorithms to the FPGA 2103, either as high level programming language (e.g., C code or the like) in an embedded soft processor, or for even more efficiency and high speed, as hardware description language (e.g., HDL code or the like). The host computer 2101 may be connected through a standard interface, i.e., a universal serial bus (USB) connection, and may be responsible only for controlling the progress of the calibration and transferring and storing resultant calibration parameters. The FPGA 2103, while performing various methodologies including the calibration algorithm, may communicate directly with DACs 2117 that are configured to drive currents to various components including laser mirrors of the tunable laser 2109 and communicates with ADCs 2107 that are configured to monitor the electrode voltages and/or power detectors to collect data from the tunable laser 2109 required by the present technology. Alternatively, and/or in addition to, the FPGA 2103 may control transients in laser temperature by monitoring a thermistor on the tunable laser 2109 and driving a current control input to a TEC controller of the tunable laser 2109. Since the FPGA 2103 may be massively parallel in its processing, no overhead may be incurred by the simultaneous operation of this function with the calibration methodology described herein.

Further, the FPGA 2103 may buffer or store data collected from the laser 2109 in one or more storage devices such as the memory 2111 (e.g., SDRAM), execute various aspects of the present technology, and produce a set of calibration parameters much smaller in size than a raw data set. In an aspect of the present disclosure, it is only this reduced set of parameters (and/or data) that the host controller 2101 may need to transfer and store, thereby greatly increasing efficiency in calibrating the laser 2109. In the example, the host controller 2101 may need only to manage the reduced data set, start and stop a calibration process, inform a human test operator of calibration status/results, and allow the operator to set calibration parameters.

Since the FPGA based implementation of the present technology may be optimized for a hardware architecture and the methodology or algorithm itself, negligible overhead may be incurred in the processing of the methodology in the FPGA 2103, and data transfers to and from the coupled ADCs 2107, DACs 2117, and memory 2111 may be very efficient. As a result, the calibration system (e.g., the system 2100) is now no longer limited in its performance by its own overhead and transfer rates, but by the performance of the laser itself (e.g., the laser 2109), including a wavelength settling time due to thermal transients on electrode current changes.

By way of example, an example architecture as described herein may set the current of or read the voltage of a single electrode at a rate of 100 KHz. Assuming that to collect a single data point for a gain voltage map two laser electrode currents need to be changed and one electrode voltage needs to be measured, data points can be collected at about 30 KHz, or about 33 us per data point. Assuming the laser settling time is fast enough, an entire gain voltage map may be collected in ⅓ of a second, orders of magnitude faster than with the existing COTS equipment. Furthermore, if the example architecture described herein is employed as a controller for the laser/modulator in a delivered product (e.g., a tunable laser), a gain voltage map may be collected and processed in service with a minimal downtime and transferred to a human or autonomous operator via SDN to monitor and/or re-calibrate the delivered product in the field.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

Figure 22:
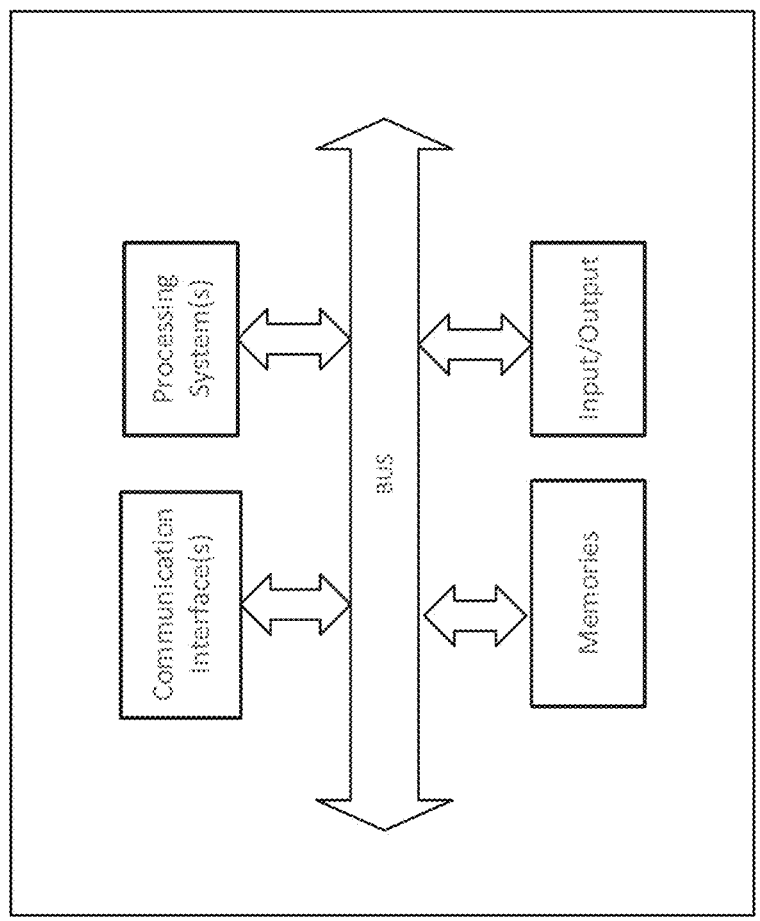
FIG. 22 is a diagram illustrating an example of a system in accordance with an aspect of the present disclosure.

Various aspects of the present disclosure may also be implemented by one or more processing systems. For example, the host controller 2101, FPGA 2103, or Laser 2109 may be implemented with a bus architecture, which may include a bus and any number of interconnecting buses and bridges, as shown in FIG. 22. The bus links together various circuits including one or more processing systems (or processors), one or more memories, one or more communication interfaces, and input/output devices. The one or more processing systems are responsible for managing the bus and general processing, including the execution of software stored on the non-transitory computer-readable medium. As noted, the one or more processing systems may include one or more processors, microprocessors that interpret and execute instructions. In other implementations, the one or more processing systems may be implemented as or include one or more application specific integrated circuits, field programmable logic arrays, or the like. The software, when executed by the one or more processing systems, causes the one or more processing systems to perform the various functions described herein for any particular apparatus. The non-transitory computer-readable medium may also be used for storing data that is manipulated by the one or more processing systems when executing software. The one or more memories may include various types of memories including a random access memory or a read only memory, and/or other types of magnetic or optical recording medium and its corresponding derive for storing information and/or instructions. The one or more communication interfaces may also include any transceiver like mechanism that enables communication with other devices and/or systems, including optical transceivers (e.g., TOSA and/or ROSA). The one or more input/output devices may include devices that permit inputting information and/or outputting information to an external device or equipment.

Even though particular combinations of features are disclosed in the specification and/or recited in the claims, these combinations are not intended to limit the disclosure of the present technology. Further, the methods or methodologies for the present technology disclosed herein may be implemented in software, hardware, any combinations of software and hardware, a computer program or firmware incorporated in a computer readable medium for execution by a controller, a processor, a computer, or a processing system that includes one or more processors. Examples of processors include microcontrollers, microprocessors, digital signal processors (DSPs), discrete hardware circuits, gated logic, state machines, programmable logic devices (PLDs), field programmable gate arrays (FPGAs), application specific integrated circuits (ASICs), and other suitable hardware configured to perform various functions described herein.

The term "software" used herein is to be construed broadly to mean any instructions, instruction sets, programs, subprograms, code, program code, software modules, applications, software packages, routines, objects, executables, threads of execution, procedures, functions, etc. including firmware, microcode, middleware, software, hardware description language, or the like. Also, the software may include various types of machine instructions including instructions, code, programs, subprograms, software modules, applications, software packages, routines, subroutines, executables, procedures, functions, etc. Further, the software may also refer to general software, firmware, middleware, microcode, hardware description language, or etc. As noted above, the software may be stored on a computer-readable medium.

Examples of a computer-readable medium may include a non-transitory computer-readable medium, such as, by way of example, an optical disk, a magnetic storage device, a digital versatile disk, a flash memory, random access memory (RAM), static random access memory (SRAM), synchronous dynamic random access memory (SDRAM), read only memory (ROM), a register, programmable ROM (PROM), erasable PROM (EPROM), electrically erasable PROM (EEPROM), a removable disk, a flash memory device, and any other suitable medium for storing software that may be accessed and read by a processor or a processing system. It is also appreciated that one skilled in the art will recognize how best to implement the described functionality relating to adding new system functionalities to an existing network element, depending upon a particular application within design constraints.

The term "unit" or "component" used herein means software, hardware, or any combinations thereof. A component may be implemented as a software component, a hardware component, or any combinations thereof, including a field programmable gate array (FPGA), digital logic, digital logic arrays, application specific integrated circuit (ASIC), digital signal processor (DSP), microcontroller, microprocessor, etc. or any combinations thereof. The component thus may include software components, task components, processes, procedures, functions, program code, firmware, micro-codes, circuits, data structures, tables, arrays, and variables.

While for the purpose of simplicity the methodologies are described herein as a series of steps or acts, it is to be understood that the claimed subject matter is not limited by the order of steps or acts, as some steps or acts may occur in different orders and/or concurrently with other acts from that shown and described herein. Further, not all illustrated steps or acts may be required to implement various methodologies according to the present technology disclosed herein. Furthermore, the methodologies disclosed herein and throughout this specification are capable of being stored on an article of manufacture to facilitate transporting and transferring such methodologies to one or more processing systems. The term "article of manufacture" as used herein is intended to encompass a computer program accessible from any computer-readable device, carrier, or medium.

The terms "first," "second," and so forth used herein may be used to describe various components, but the components are not limited by the above terms. The above terms are used only to discriminate one component from the other component. For example, without departing from the scope of the present disclosure, a second component may be referred to as a first component, and the first component may be referred to as the second component in a similar manner. Also, the term "and/or" used herein includes a combination of a plurality of associated items or any item of the plurality of associated items.

Further, it is to be noted that when it is described that an element is "coupled" or "connected" to another element, the element may be directly coupled or directly connected to the other element, or the element may be coupled or connected to the other element through a third element. A singular form may include a plural form if there is no clearly opposite meaning in the context. In the present disclosure, the term "include" or "have" used herein indicates that a feature, an operation, a component, a step, a number, a part or any combination thereof described herein is present. However, the term "include" or "have" does not exclude a possibility of presence or addition of one or more other features, operations, components, steps, numbers, parts or combinations. Also, as used herein, the article "a" is intended to include one or more items. Further, no element, act, step, or instruction used in the present disclosure should be construed as critical or essential to the present disclosure unless explicitly described as such in the present disclosure.

Although the present technology has been illustrated with specific examples described herein for purposes of describing example embodiments, it is appreciated by one skilled in the relevant art that a wide variety of alternate and/or equivalent implementations may be substituted for the specific examples shown and described without departing from the scope of the present disclosure. As such, the present disclosure is intended to cover any adaptations or variations of the examples and/or embodiments shown and described herein, without departing from the spirit and the technical scope of the present disclosure.

What is claimed is:
1. A method for calibrating a tunable laser for optical communications, the tunable laser being configured to provide access to multiple facets of a plurality of mirrors at an optical output, each mirror having a different sampled grating period, the method comprising:
   determining mirror currents that are needed to tune the plurality of mirrors to a desired wavelength for the tunable laser, via electronic circuit, based on at least one of: a gain-voltage map of a gain section of the tunable laser, a semiconductor optical amplifier (SOA) photocurrent map, mirror reflection spectra of the plurality of mirrors, and mode-hopping of the tunable laser.
2. The method of claim 1, further comprising:
   monitoring, via the electronic circuit, voltage values of the gain section of the tunable laser over a span of mirror currents; and
   determining, via the electronic circuit, points of voltage drops or minima, the points of voltage drops or minima being representing that the tunable laser is outputting maximum power at a set of mirror currents.
3. The method of claim 1, further comprising:
   monitoring, via the electronic circuit, output power from each facet of the plurality of mirrors, via a plurality of SOAs configured to operate as photodetectors;
   determining, via the electronic circuit, the SOA photocurrent map of a SOA based on varying mirror currents and optical output from the tunable laser, the SOA being one of the plurality of SOAs; and
   determining, via image processing on the SOA photocurrent map by the electronic circuit, center locations of contours on the determined SOA photocurrent map.
4. The method of claim 3, further comprising:
   forward biasing, via the electronic circuit, one of the plurality of SOAs; and
   reverse biasing, via the electronic circuit, the remaining other SOAs of the plurality of SOAs.
5. The method of claim 1, further comprising:
   Obtaining, via the electronic circuit, reflection spectra of the plurality of mirrors over a span of mirror currents; and
   determining, via the electronic circuit, mirror currents that are needed to tune the plurality of mirrors to the desired wavelength for the tunable laser, based on an analysis of the reflection spectra of the plurality of mirrors.
6. The method of claim 1, further comprising:
   determining, via the electronic circuit, one or more starting points of wavelength hops;
   tracing, via the electronic circuit, the wavelength hops along a one-dimensional line of mirror currents on the plurality of mirrors;
   determining, via the electronic circuit, operating settings of mirror currents for the desired wavelength; and
   optimizing, via the electronic circuit, a cavity mode position of the tunable laser, which acts as a fine tuning of the tunable laser.
7. The method of claim 3, wherein the plurality of SOAs are disposed in a photonic integrated circuit (PIC) of the tunable laser.
8. The method of claim 3, wherein the plurality of SOAs are disposed outside a photonic integrated circuit (PIC) of the tunable laser.
9. The method of claim 1, wherein the plurality of mirrors each comprise a sampled grating distributed Bragg reflector mirror.

10. The method of claim 1, further comprising storing values of the mirror currents for the desired wavelength as a look-up table in memory.
11. The method of claim 2, further comprising:
   generating, via the electronic circuit, the gain voltage map over the span of mirror currents; and
   identifying, via image processing of the electronic circuit, minima in the gain voltage map.
12. The method of claim 11, further comprising:
   forward biasing, via the electronic circuit, one of the plurality of SOAs;
   reverse biasing, via the electronic circuit, the remaining SOAs of the plurality of SOAs;
   collecting, via the electronic circuit, data on optical outputs of the plurality of SOAs; and
   determining, via the electronic circuit, an optical spectrum over the span of mirror currents, based on the collected data.
13. The method of claim 5, further comprising:
   Measuring, via the electronic circuit, mirror reflection spectra from the plurality of mirrors; and
   determining, via the electronic circuit, peak wavelengths based on the measured mirror reflection spectra.
14. The method of claim 13, wherein determining peak wavelengths based on the measured mirror reflection spectra comprises:
   determining, via the electronic circuit, an underlying amplified spontaneous emission (ASE);
   applying, via the electronic circuit, an averaging operation to the measured mirror reflection spectra; and
   subtracting, via the electronic circuit, the underlying amplified spontaneous emission from the averaged mirror reflection spectra.
15. The method of claim 14, further comprising:
   applying, via the electronic circuit, a polynomial fit to data including a plurality of traces of the determined peak wavelengths over the plurality of mirror currents; and
   storing, via the electronic circuit, the polynomial fitted data in memory as a look-up table.
16. The method of claim 1, wherein the electronic circuit comprises at least one of: a processor, a microcontroller, a field programmable gate array (FPGA), or an application specific integrated circuit (ASIC).
17. An apparatus for wavelength calibration of an optical communication device, the apparatus comprising:
   a tunable laser configured to provide access to multiple facets of a plurality of mirrors at an optical output, each mirror having a different sampled grating period; and
   electronic circuit coupled to the tunable laser and a host controller, wherein the electronic circuit is configured to:
   determine mirror currents that are needed to tune the plurality of mirrors to a desired wavelength for the tunable laser, based on at least one of: a gain-voltage map of a gain section of the tunable laser, a semiconductor optical amplifier (SOA) photocurrent map, reflection spectra of the plurality of mirrors, and mode-hopping of the tunable laser.
18. The apparatus of claim 17, wherein the plurality of mirrors each comprise a sampled grating distributed Bragg reflector mirror.
19. The apparatus of claim 17, wherein the electronic circuit comprises at least one of: a processor, a microcontroller, a field programmable gate array (FPGA), or an application specific integrated circuit (ASIC).

20. The apparatus of claim 17, further comprising a plurality of semiconductor optical amplifiers (SOAs) corresponding to the plurality of mirrors.

21. The apparatus of claim 17, further comprising a memory coupled to the electronic circuit and configured to store the mirror currents for the desired wavelength of the tunable laser.

22. The apparatus of claim 17, wherein the electronic circuit is further configured to:
monitor voltage values of the gain section of the tunable laser over a span of mirror currents; and
determine points of voltage drops or minima, the points of voltage drops or minima being representing that the tunable laser is outputting maximum power at a set of mirror currents.

23. The apparatus of claim 17, wherein the electronic circuit is further configured to:
monitor output power from each facet of the plurality of mirrors, via a plurality of SOAs configured to operate as photodetectors;
determine the SOA photocurrent map, based on varying mirror currents and optical output from the tunable laser, the SOA photocurrent map being associated with one of the plurality of SOAs; and
determine, via image processing on the SOA photocurrent map, center locations of contours on the determined SOA photocurrent map.

24. The apparatus of claim 23, wherein the electronic circuit is further configured to:
forward bias one of the plurality of SOAs; and
reverse bias the remaining other SOAs of the plurality of SOAs.

25. The apparatus of claim 17, wherein the electronic circuit is further configured to:
obtain reflection spectra of the plurality of mirrors over a span of mirror currents; and
determine mirror currents that are needed to tune the plurality of mirrors to the desired wavelength for the tunable laser, based on an analysis of the reflection spectra of the plurality of mirrors.

26. The apparatus of claim 17, wherein the electronic circuit is further configured to:
determine one or more starting points of wavelength hops;
trace the wavelength hops along a one-dimensional line of mirror currents on the plurality of mirrors;
determine operating settings of mirror currents for the desired wavelength; and
optimize a cavity mode position of the tunable laser, which acts as a fine tuning of the tunable laser.

* * * * *